(12) United States Patent
Yu et al.

(10) Patent No.: US 12,532,574 B2
(45) Date of Patent: Jan. 20, 2026

(54) METHOD OF PREPARING A DEVICE COUPON FOR MICRO-TRANSFER PRINTING, DEVICE WAFER INCLUDING SAID DEVICE COUPON, AND OPTOELECTRONIC DEVICE MANUFACTURED FROM SAID DEVICE WAFER

(71) Applicant: ROCKLEY PHOTONICS LIMITED, Altrincham (GB)

(72) Inventors: Guomin Yu, Glendora, CA (US); Mohamad Dernaika, Cork (IE); Ludovic Caro, Cork (IE); Hua Yang, Cork (IE); Aaron John Zilkie, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 855 days.

(21) Appl. No.: 17/733,947

(22) Filed: Apr. 29, 2022

(65) Prior Publication Data
US 2022/0367750 A1 Nov. 17, 2022

Related U.S. Application Data

(63) Continuation-in-part of application No. PCT/EP2021/069512, filed on Jul. 13, 2021.
(Continued)

(51) Int. Cl.
*H10H 20/01* (2025.01)
*H01L 21/683* (2006.01)
(Continued)

(52) U.S. Cl.
CPC ......... *H10H 20/018* (2025.01); *H10F 71/127* (2025.01); *H01L 21/683* (2013.01);
(Continued)

(58) Field of Classification Search
CPC ... H10H 20/018; H10F 71/127; H01L 21/683; H01L 21/6835; H01L 21/7806
See application file for complete search history.

(56) References Cited

U.S. PATENT DOCUMENTS

2013/0196474 A1   8/2013   Meitl et al.
2013/0221355 A1*  8/2013   Bower ............... H10H 20/857
                                                          438/669
(Continued)

FOREIGN PATENT DOCUMENTS

WO   2011123285 A1   10/2011

OTHER PUBLICATIONS

De Groote, A. et al., "Integration of a III-V light emitter on a silicon photonic IC through transfer printing", pp. 166-167, IEEE.
(Continued)

*Primary Examiner* — Davienne N Monbleau
*Assistant Examiner* — Heim Kirin Grewal
(74) *Attorney, Agent, or Firm* — Womble Bond Dickinson (US) LLP

(57) ABSTRACT

A method of preparing a device coupon for a micro-transfer printing process from a multi-layered stack located on a device wafer substrate. The multi-layered stack comprises a plurality of semiconductor layers. The method comprises steps of: (a) etching the multi-layered stack to form a multi-layered device coupon, including an optical component; and (b) etching a semiconductor layer of the multi-layered device coupon to form one or more tethers, said tethers securing the multi-layered device coupon to one or more supports.

14 Claims, 44 Drawing Sheets

Related U.S. Application Data

(60) Provisional application No. 63/051,113, filed on Jul. 13, 2020.

(51) Int. Cl.
  *H01L 21/78* (2006.01)
  *H10F 71/00* (2025.01)

(52) U.S. Cl.
  CPC ...... *H01L 21/6835* (2013.01); *H01L 21/7806* (2013.01); *H01L 2221/68354* (2013.01); *H01L 2221/68368* (2013.01)

(56) References Cited

U.S. PATENT DOCUMENTS

| | | | |
|---|---|---|---|
| 2014/0361409 A1* | 12/2014 | Rogers | H10F 10/142 438/94 |
| 2015/0380619 A1 | 12/2015 | Bower et al. | |
| 2017/0025563 A1* | 1/2017 | Meitl | H10H 20/01335 |
| 2017/0200707 A1 | 7/2017 | Rogers et al. | |

OTHER PUBLICATIONS

International Search Report and Written Opinion of the International Searching Authority, Mailed Oct. 28, 2021, Corresponding to PCT/EP2021/069512, 21 pages.

\* cited by examiner

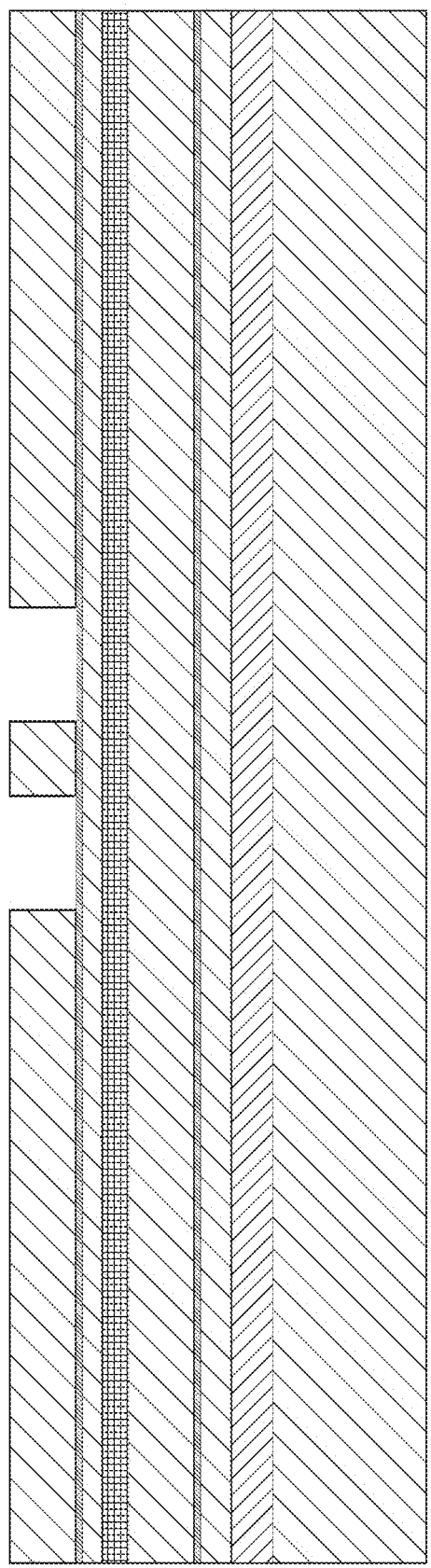
FIG. 20(iii)

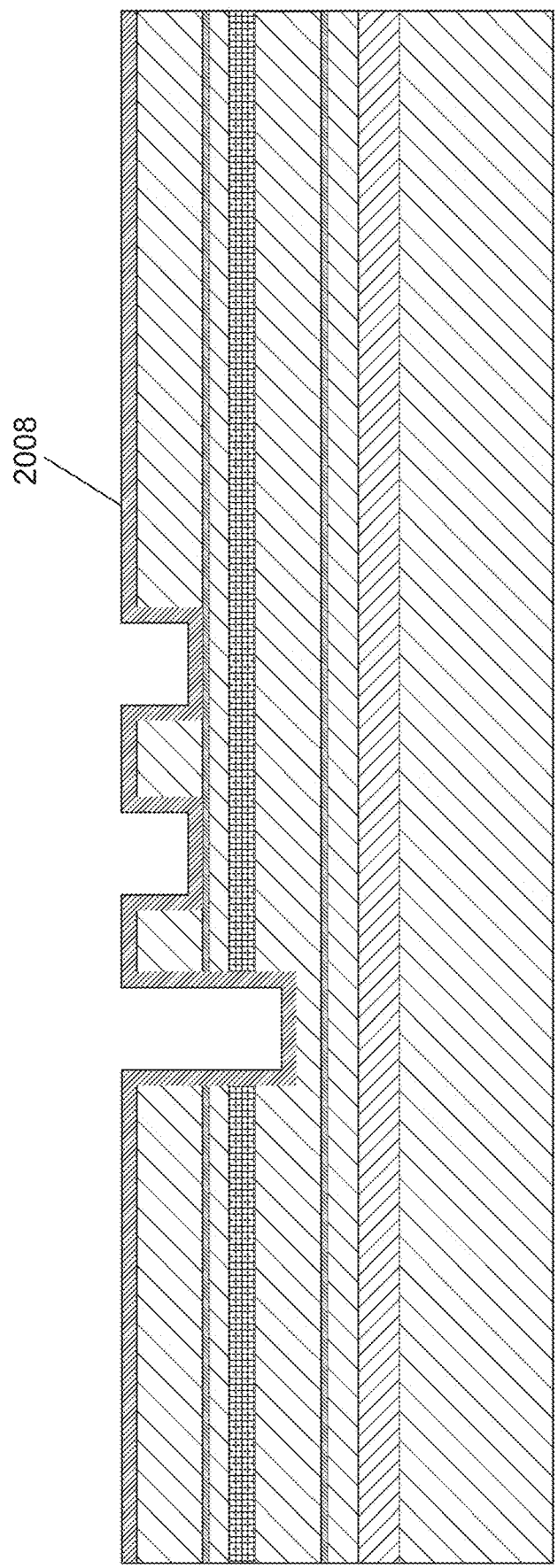
FIG. 20(vii)

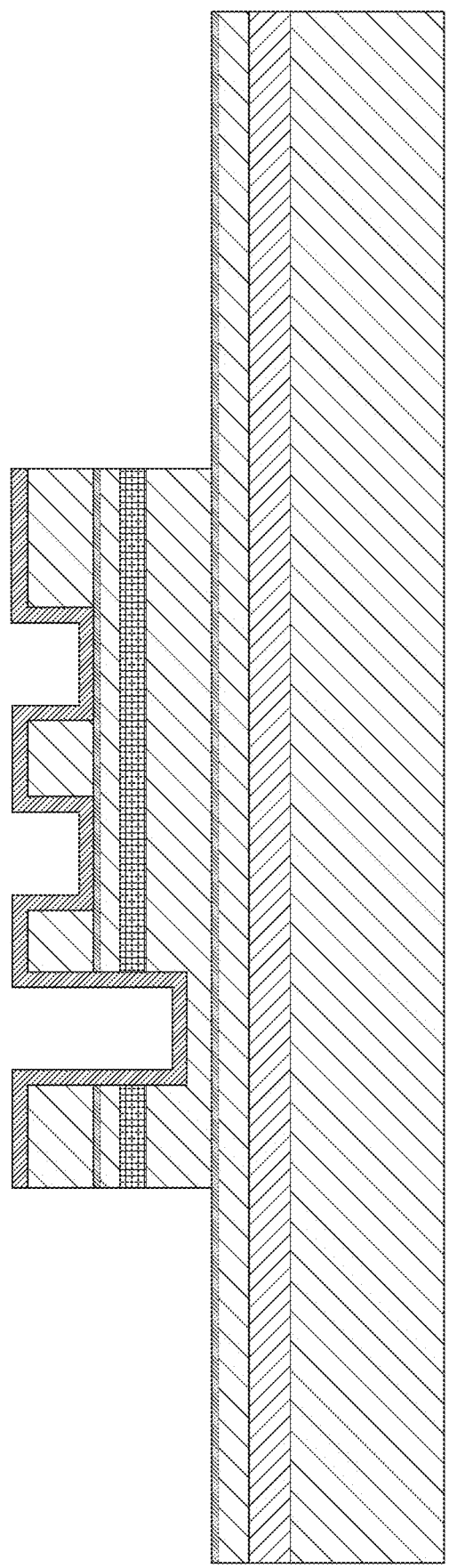
FIG. 20(viii)

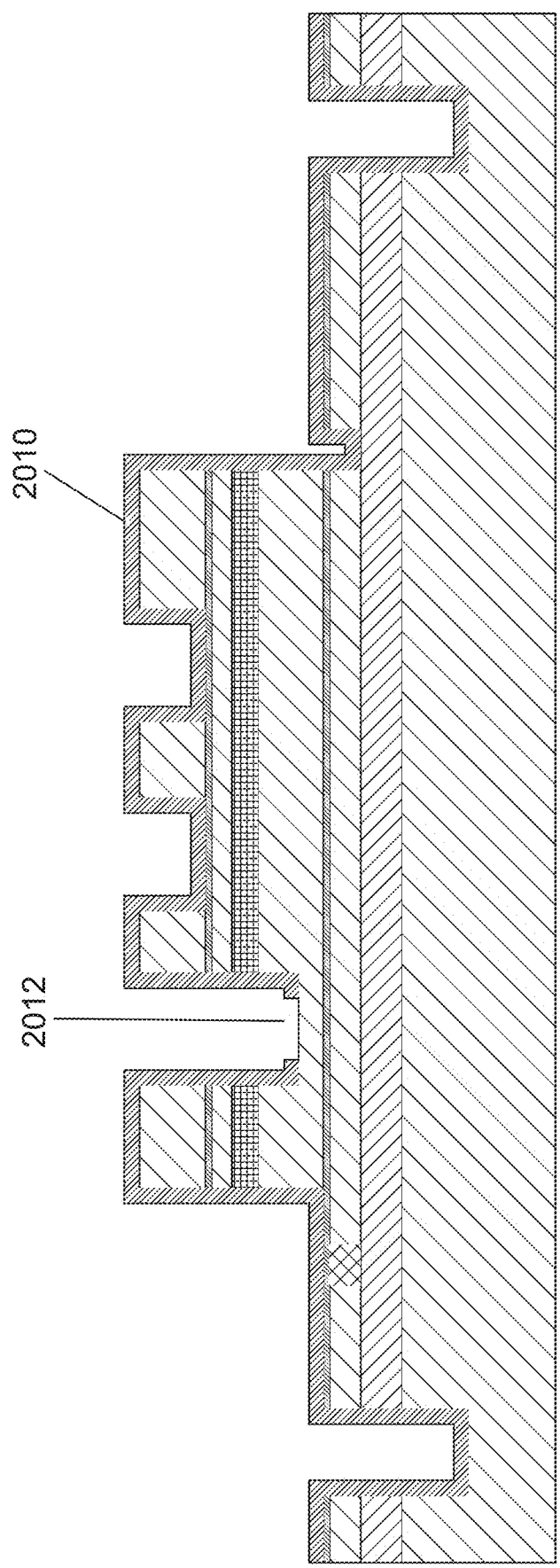
FIG. 20(xiii)

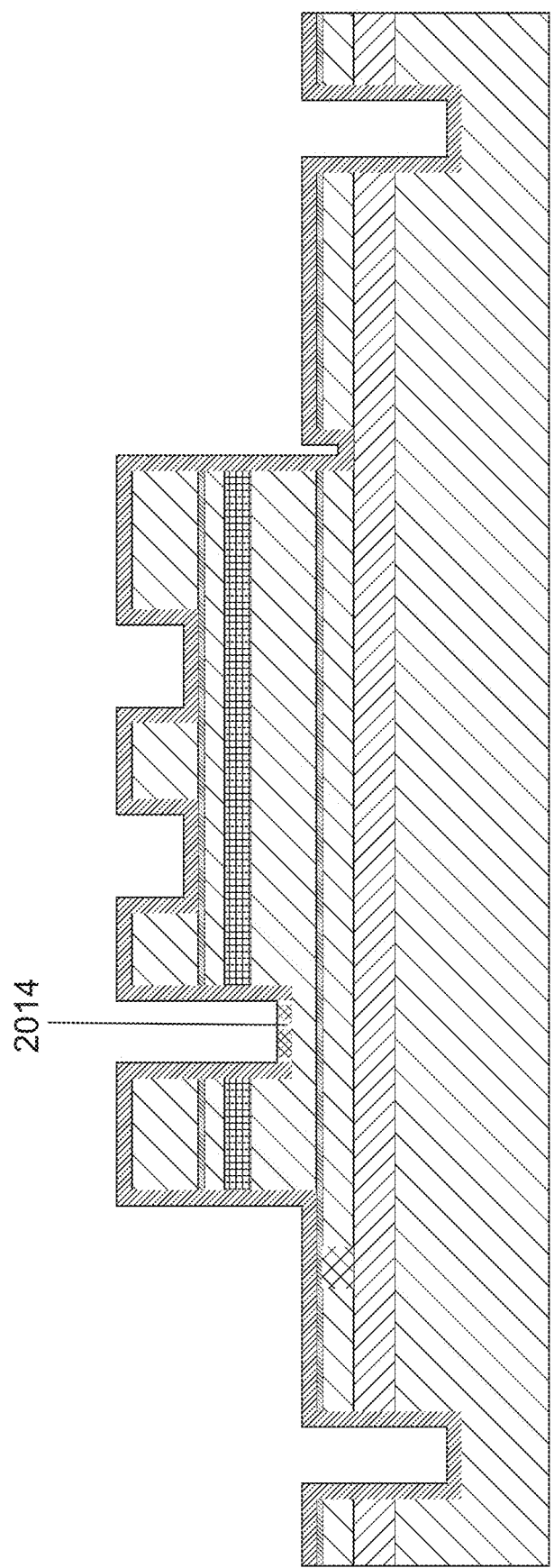
FIG. 20(xiii)

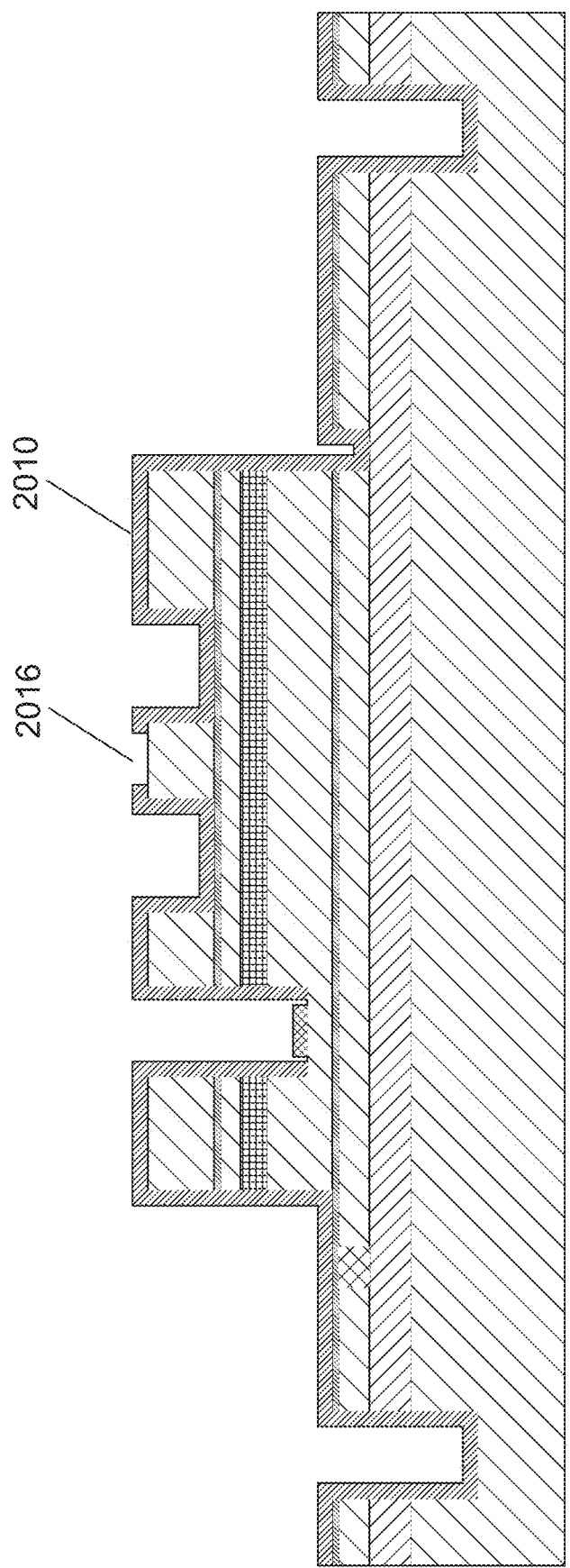
FIG. 20(xiv)

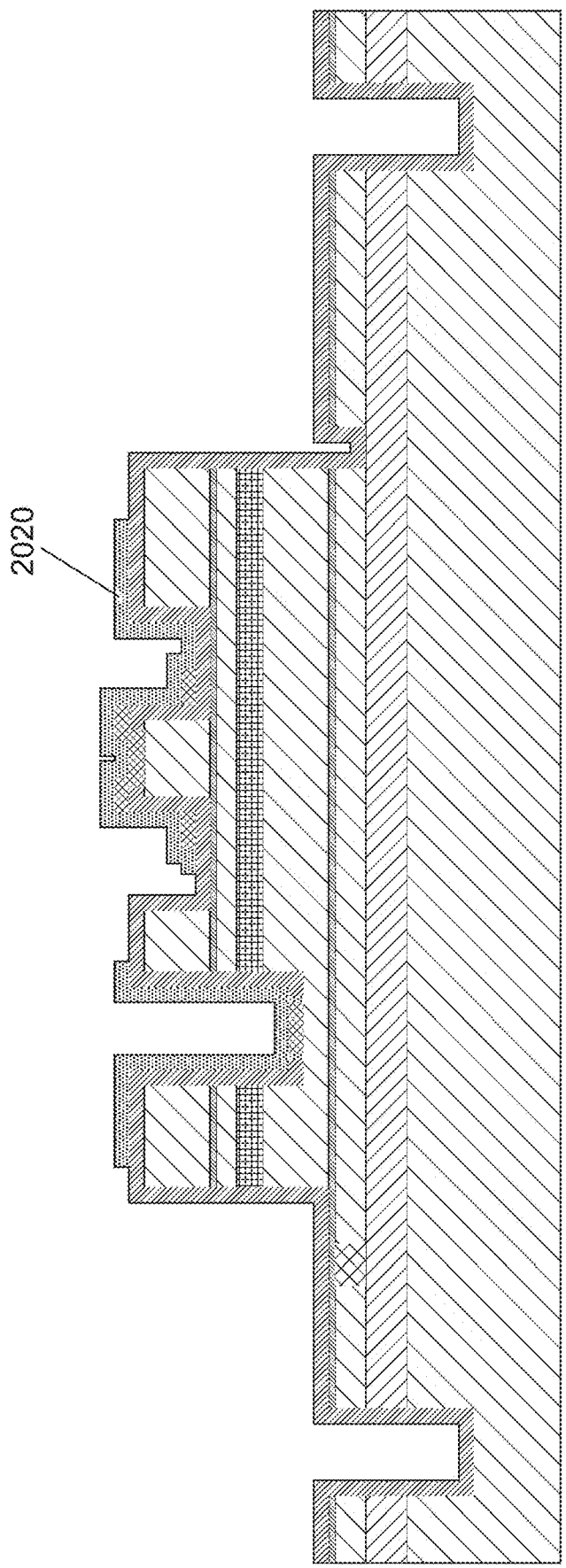
FIG. 20(xvi)

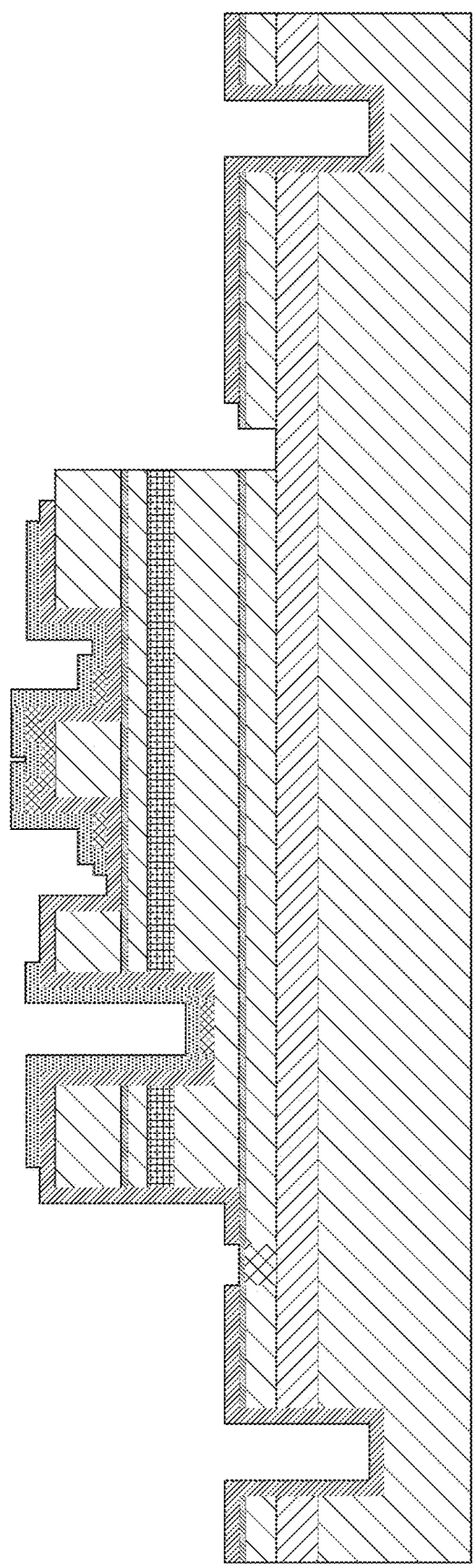
FIG. 20(xvii)

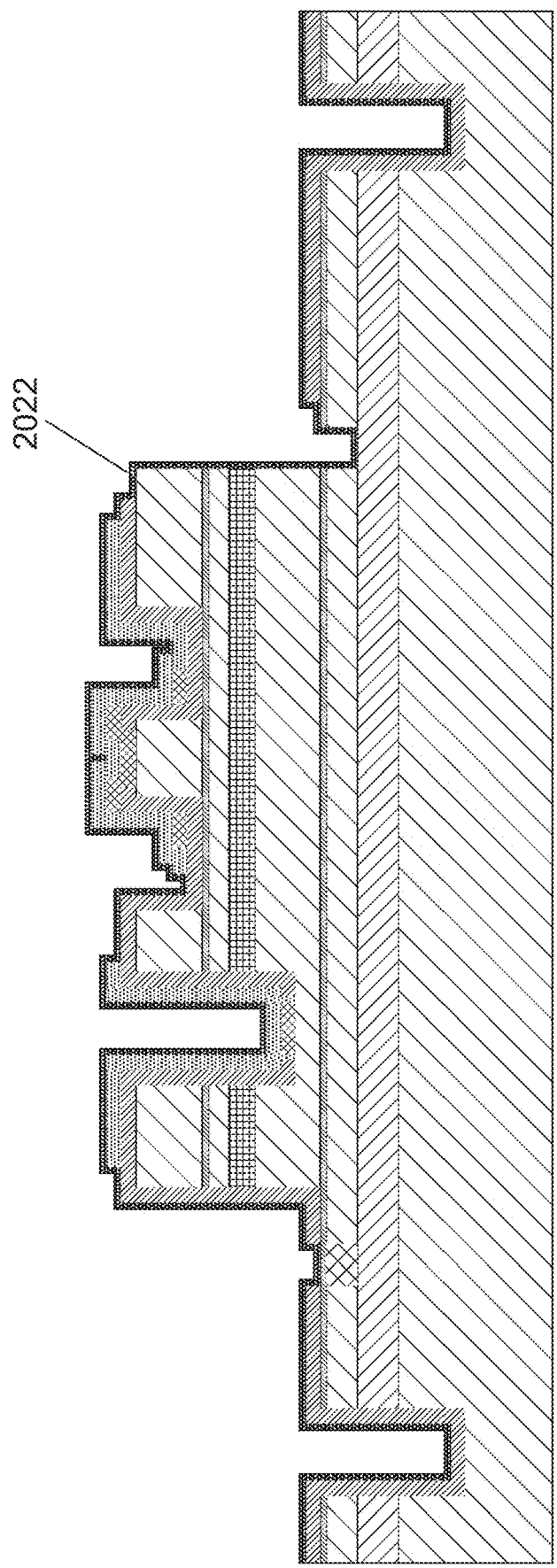
FIG. 20(xviii)

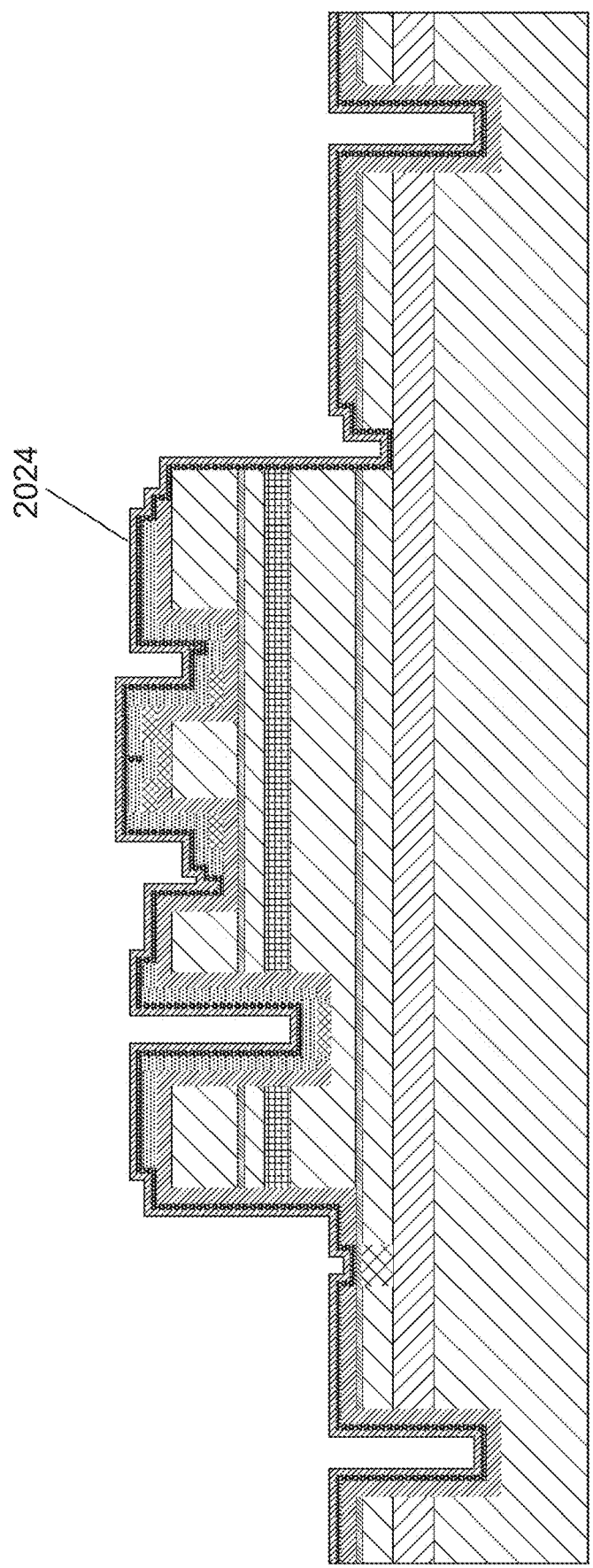
FIG. 20(xix)

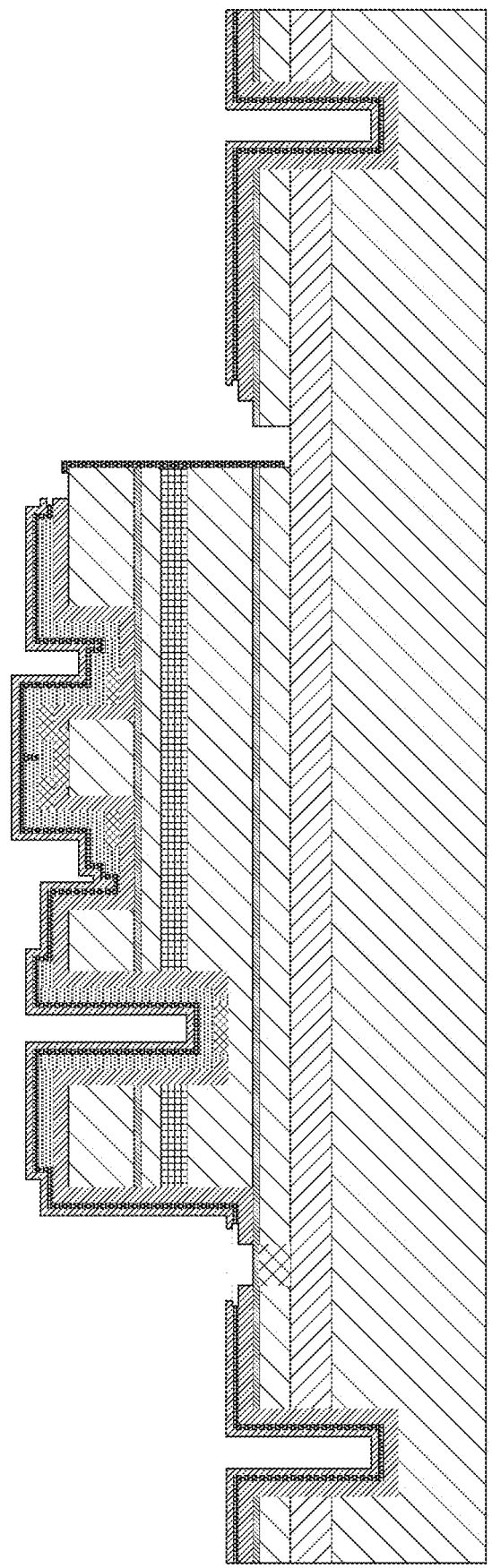
FIG. 20(xxi)

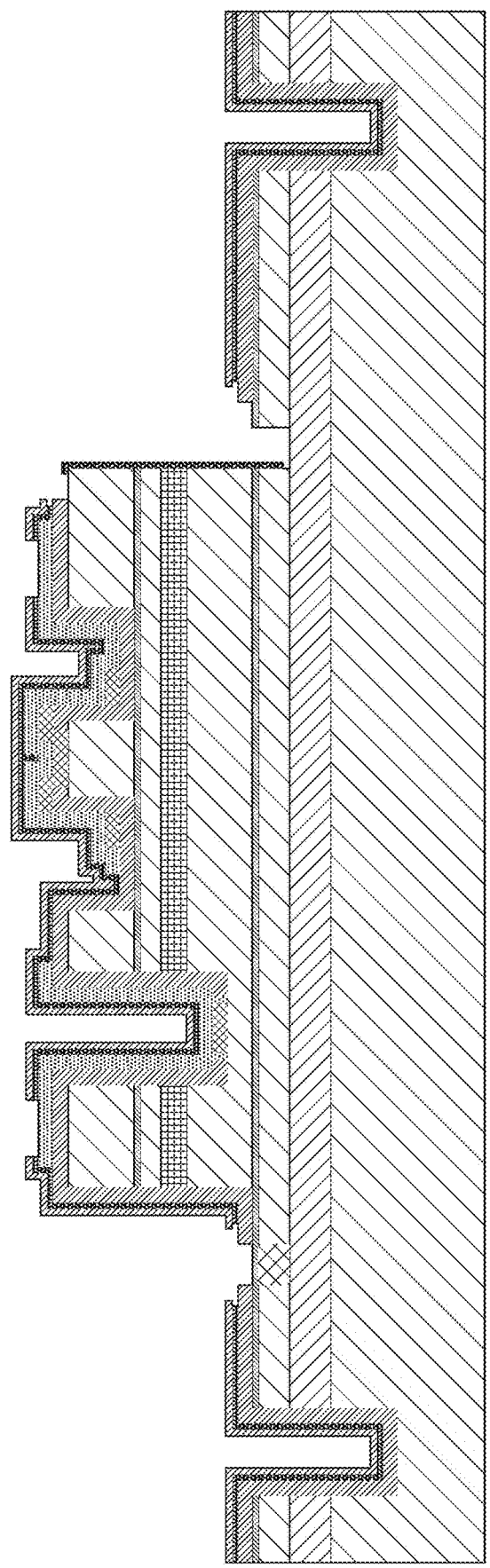
FIG. 20(xxii)

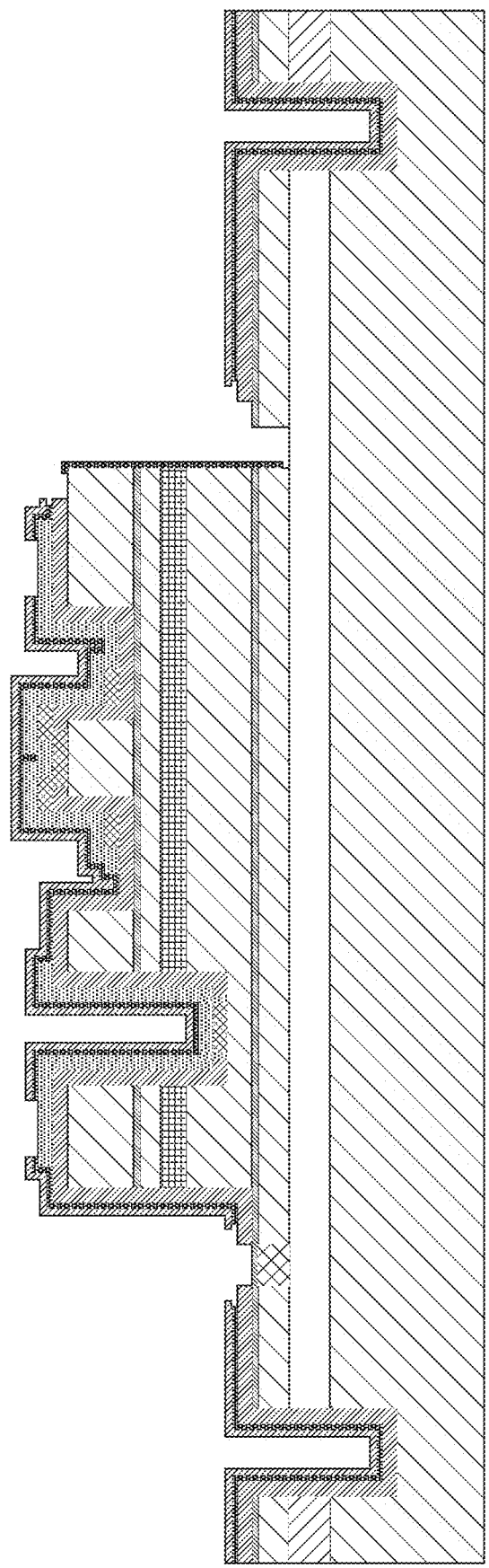
FIG. 20(xxiii)

METHOD OF PREPARING A DEVICE COUPON FOR MICRO-TRANSFER PRINTING, DEVICE WAFER INCLUDING SAID DEVICE COUPON, AND OPTOELECTRONIC DEVICE MANUFACTURED FROM SAID DEVICE WAFER

CROSS-REFERENCE TO RELATED APPLICATION(S)

The present application is a continuation-in-part of International Patent Application No. PCT/EP2021/069512, filed Jul. 13, 2021, entitled "METHOD OF PREPARING A DEVICE COUPON FOR MICRO-TRANSFER PRINTING, DEVICE WAFER INCLUDING SAID DEVICE COUPON, AND OPTOELECTRONIC DEVICE MANUFACTURED FROM SAID DEVICE WAFER", which claims priority to and the benefit of U.S. Provisional Application No. 63/051,113, filed Jul. 13, 2020, entitled "METHOD, DEVICE WAFER, AND OPTOELECTRONIC DEVICE"; the entire contents of all of the documents identified in this paragraph are incorporated herein by reference.

FIELD OF THE INVENTION

The present invention relates to methods, a device wafer, optoelectronic devices, and a device coupon.

BACKGROUND

Hybrid integration of III-V semiconductor based electro-optical devices (e.g. modulators), with silicon-on-insulator (SOI) platforms confers the advantage of combining the best parts of both material systems.

However, conventional chip bonding processes typically use flip-chip bonding, in which the III-V semiconductor based device is inverted and bonded into a cavity on the SOI platform. Devices fabricated using these methods typically suffer from high optical coupling losses between a waveguide in the III-V semiconductor based device and a waveguide in the SOI. Further, the manufacturing process has a relatively low yield, and a relatively low reliability due to difficulties in accurately controlling the alignment of the respective waveguides.

Micro-transfer printing (MTP) is therefore being investigated as an alternative way to integrate III-V semiconductor based devices with SOI wafers. In these methods, the III-V semiconductor based device, in the form of a device coupon or transfer die, can be printed into a cavity on the SOI by use of a stamp in the same orientation in which it was manufactured, and the alignment between the III-V semiconductor based device and the SOI waveguide is predetermined in the vertical direction (Z-direction). The requirements for alignment can therefore be reduced from three dimensions to two, which can be more easily fabricated.

Core to the MTP process is the provision of tethers which hold the device coupon to a wafer during processing, and which are broken during the MTP process to allow the MTP coupon to be selected by the MTP stamp. These tethers can be unreliable or nonreproducible, which has negative effects during high volume processing.

The present invention has been devised in light of the above considerations.

SUMMARY OF THE INVENTION

Accordingly, in a first aspect, embodiments of the invention provide a method of preparing a device coupon for a micro-transfer printing process from a multi-layered stack located on a device wafer substrate, the multi-layered stack comprising a plurality of semiconductor layers, the method comprising steps of:
(a) etching the multi-layered stack to form a multi-layered device coupon, including an optical component; and
(b) etching a semiconductor layer of the multi-layered device coupon to form one or more tethers, said tether securing the multi-layered device coupon to one or more supports.

Such a method results in more reliable tethers, which can improve the yield and volume of the subsequent micro-transfer printing process. For example, conventional tethers have been made using photoresist which (by its nature) is not uniform over the wafer as the thickness of the photoresist can depend on the surrounding topology as well as the proximity to the edge of the wafer. Further, debris from the breakage of photo-resist tethers can cause other issues, such as getting stuck on the stamp used during the MPT process or going underneath the coupon and preventing it from being printed or lowered properly. Whereas, when forming the or each tether from existing semiconductor layers, they can be made very uniform over the wafer which can improve the yield of the devices. Further, the uniformity of the semiconductor layers means that the semiconductor tethers can be optimised for a precise shear strength.

The method may have any one or, to the extent that they are compatible, any combination of the following optional features.

The semiconductor layer of the multi-layered device coupon etched to form the one or more tethers may be adjacent to a release layer located between the multi-layered device coupon and the device wafer substrate.

The semiconductor layer of the multi-layered device coupon etched to form the one or more tethers may be an intermediate semiconductor layer of the multi-layered device coupon, sandwiched between a first and second semiconductor layer of the multi-layered device coupon.

The semiconductor layer of the multi-layered device coupon etched form the one or more tethers may be an uppermost semiconductor layer of the multi-layered device coupon, which is a semiconductor layer furthest from the release layer.

The or each tether may extend from the device coupon to a respective support, and the or each tether may have a break region located between the device coupon and the respective support. The break region may be weaker than adjacent regions of the tether. The break region may have a width which is narrower than adjacent regions of the tether.

The method may further include a step of performing a release etch, after step (b), in which a release layer between the device coupon and the device wafer substrate is etched away. The method may further comprise a step, performed after the release etch, of covering at least a part of the device coupon, tether, and/or support with a photoresist.

The method may include a step of providing a protection layer around the or each support. The step of providing a protection layer around the or each support may be performed before performing the release etch.

The method may further include a step, performed after step (b), of disposing an anti-reflective coating around one or more lateral sides of the device coupon.

The step of etching the semiconductor layer of the multi-layered device coupon to form one or more tethers may also include forming the one or more supports, the one or more supports being attached to the device wafer substrate. After the release etch, the device coupon may be attached to the device wafer substrate only via the tether(s) and support(s).

In a second aspect, embodiments of the present invention provide a device wafer, suitable for a micro-transfer printing process, the device wafter comprising:
- a multi-layered device coupon, comprising an optical component;
- one or more supports, connected to a device wafter substrate; and
- one or more semiconductor tethers, which secure the device coupon to a respective support;
- wherein the semiconductor tether is a semiconductor layer of the multi-layered device coupon.

The device wafer may have any one or, to the extent that they are compatible, any combination of the following optional features.

The semiconductor tether may be a semiconductor layer of the multi-layered device coupon closest to the device substrate.

The semiconductor tether may be a semiconductor layer of the multi-layered device coupon which is sandwiched between a first and second semiconductor layer of the multi-layered device coupon.

The or each semiconductor tether may extend from the device coupon to a respective support, and the or each semiconductor tether may have a break region located between the device coupon and respective support. The break region may be weaker than adjacent regions of the tether. The break region may have a width which is narrower than adjacent regions of the tether. The break region may be at least partially defined by two etched regions of the tether, said etched regions having a substantially triangular shape. The two triangular etched regions may be offset from one another in a direction from the device coupon to the respective support.

There may be a gap between the device coupon and the device wafer substrate, such that the device coupon is attached to the device wafer substrate only via the tether(s) and support(s).

The device wafer may further include a protection layer around the or each support.

The device wafer may further include an anti-reflective coating around one or more lateral sides of the device coupon.

In a third aspect, embodiments of the invention provide a method of manufacturing an optoelectronic device, using the device wafer of the second aspect (and including any one, or any combination insofar as they are compatible of the optional features set out with reference thereto), comprising the steps of:
(a) releasing the device coupon from the device wafer; and
(b) bonding the device coupon onto a host substrate.

Bonding the device coupon onto the host substrate may be performed via micro-transfer printing.

In a fourth aspect, embodiments of the invention provide an optoelectronic device manufactured using the method of the third aspect (and including any one, or any combination insofar as they are compatible of the optional features set out with reference thereto).

In a fourth aspect, embodiments of the invention provide an optoelectronic device comprising a device coupon bonded to a host substrate, the device coupon being formed of one or more III-V semiconductor layers, and the host substrate is formed of silicon, wherein the device coupon includes one or more fragments of tether and the fragments(s) of tether are formed of a III-V semiconductor.

In a fifth aspect, embodiments of the invention provide a device coupon prepared using the method of the first aspect (and including any one, or any combination insofar as they are compatible of the optional features set out with reference thereto).

Further aspects of the present invention provide: a computer program comprising code which, when run on a computer, causes the computer to perform the method of the first or third aspect; a computer readable medium storing a computer program comprising code which, when run on a computer, causes the computer to perform the method of the first or third aspect; and a computer system programmed to perform the method of the first or third aspect.

The invention includes the combination of the aspects and preferred features described except where such a combination is clearly impermissible or expressly avoided.

SUMMARY OF THE FIGURES

Embodiments and experiments illustrating the principles of the invention will now be discussed with reference to the accompanying figures in which.

DETAILED DESCRIPTION OF THE INVENTION

Aspects and embodiments of the present invention will now be discussed with reference to the accompanying figures. Further aspects and embodiments will be apparent to those skilled in the art.

Figure 1A:
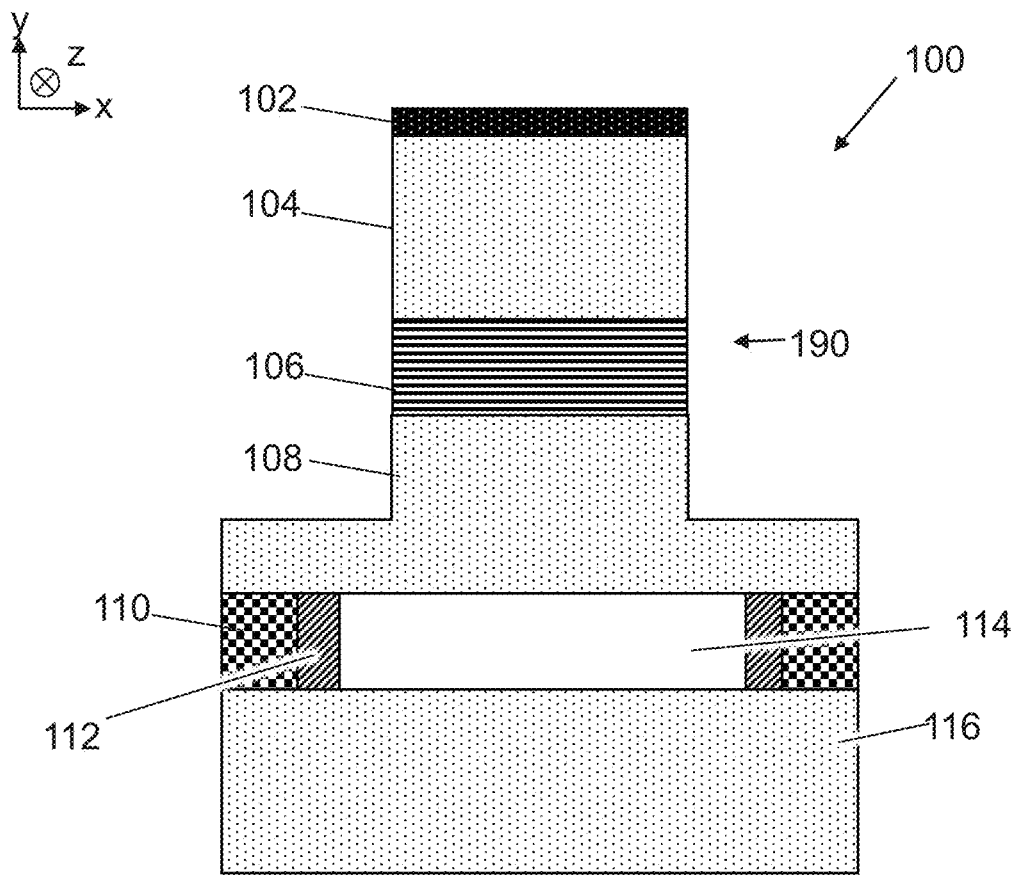
FIGS. 1A and 1B are cross-sectional and top-down views, respectively, of a device wafer.
Figure 1B:
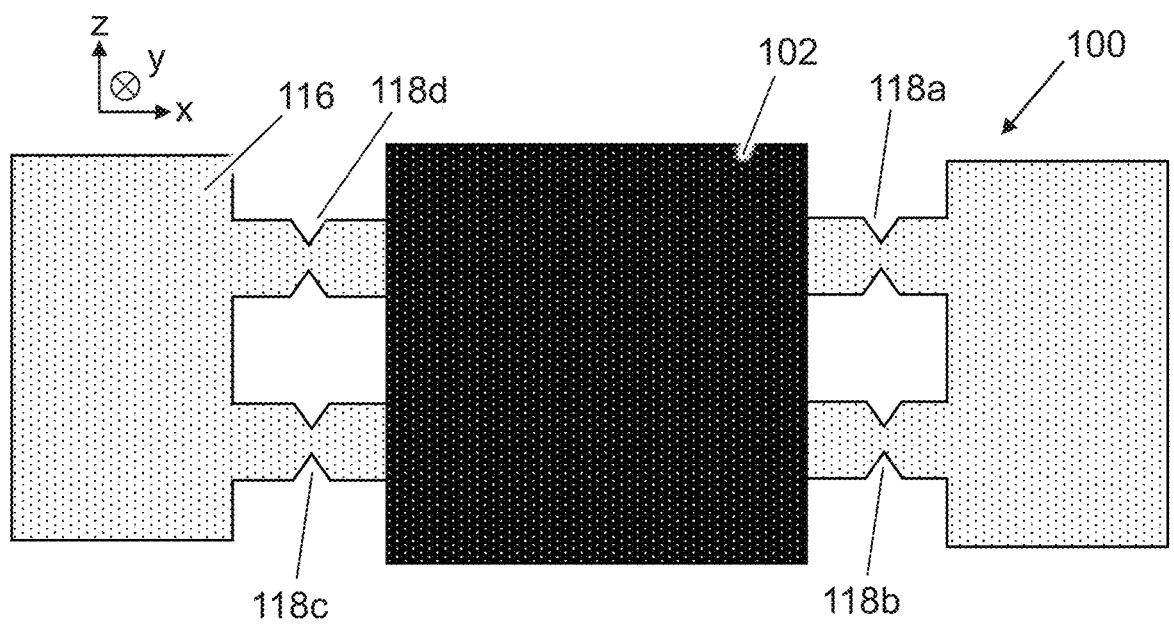

FIGS. 1A and 1B are cross-sectional and top-down views, respectively, of a device wafer 100. The device wafer 100 includes a multi-layered device coupon 190 which includes an optical component e.g. a waveguide, modulator, photodiode etc. In this example, the multi-layered device coupon includes a contact layer or layers 102 (e.g. ones which may be used for electrical contact on a final device), a first semiconductor layer 104, a second semiconductor layer 106, and a third semiconductor layer 108. The first and third semiconductor layers are, in this example, p doped indium phosphide (p-InP). The second semiconductor layer 106, in this example, is a quaternary active layer. The device coupon 190 is separated from a host wafer substrate 116 by an air gap 114 and attached to the substrate by support pillars 110. The air gap 114 extends between a lowermost surface of the device coupon and the uppermost surface of the substrate 116. The support pillars are protected by a dielectric layer 112. In the top-down view (FIG. 1B) the structure of tethers 118a-118d can be seen. The tethers are formed from semiconductor layer 108, in that (as discussed below) the semiconductor layer is provided and then etched to define the one or more tethers 118a-118d. The tethers extend to, and are formed of an extension of, layer 116 of the device wafer 100.

Figure 2A:
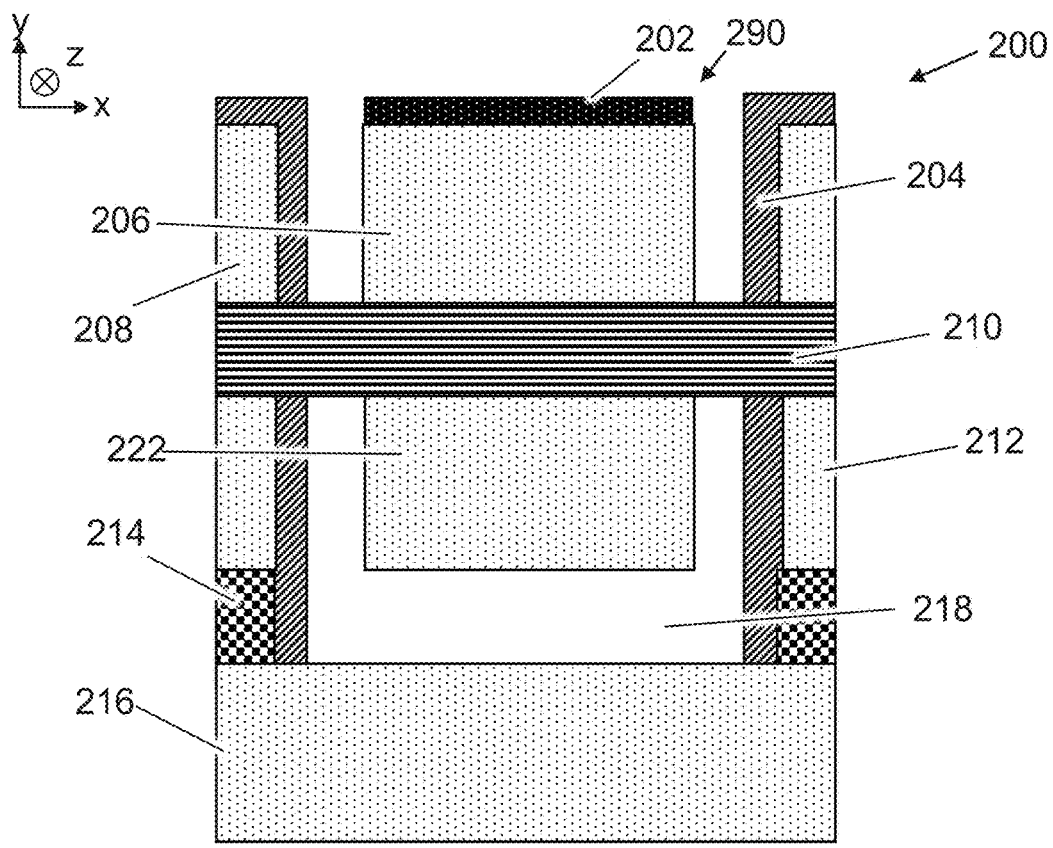
FIGS. 2A and 2B are cross-sectional and top-down views, respectively, of a variant device wafer.
Figure 2B:
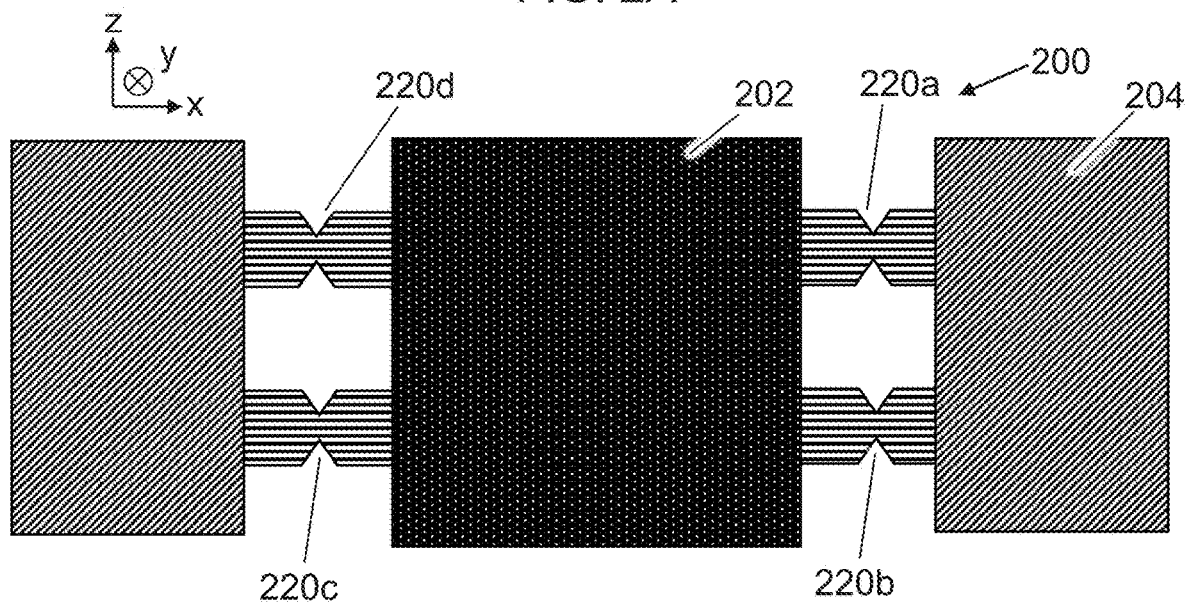

FIGS. 2A and 2B are cross-sectional and top-down views, respectively, of a variant device wafer 200. The device wafer 200 includes a multi-layered device coupon 190 which, as above, includes an optical component. In this example the multi-layered device coupon includes a contact layer or layers 202, a first semiconductor layer 206/208, a second semiconductor layer 210, and a third semiconductor layer 212/222. The first and second semiconductor layers are, in this example, p doped indium phosphide (p-InP). The second semiconductor layer 210 is, in this example, a quaternary active layer. The device coupon 290 is separated from a host wafer substrate 216 by an air gap 218. In this instance, because the second semiconductor layer 210 is the one providing tethers 220a-d (see FIG. 2B) the air gap extends not only beneath the device coupon (i.e. between the lowermost surface of the device coupon and the uppermost surface of the substrate 216) but also along one or more lateral sides of the device coupon 290. This variant wafer requires the use of a selective etch to remove portions of the first and third semiconductor layers, but to retain the portion of the second semiconductor layer which is to form the tether(s). A dielectric protection layer 204 is provided around the support pillars 214 as before. In a further embodiment, not shown, the semiconductor layer forming the tether may be the uppermost semiconductor layer in the stack e.g. layer 104, 206/208.

Figure 3A:
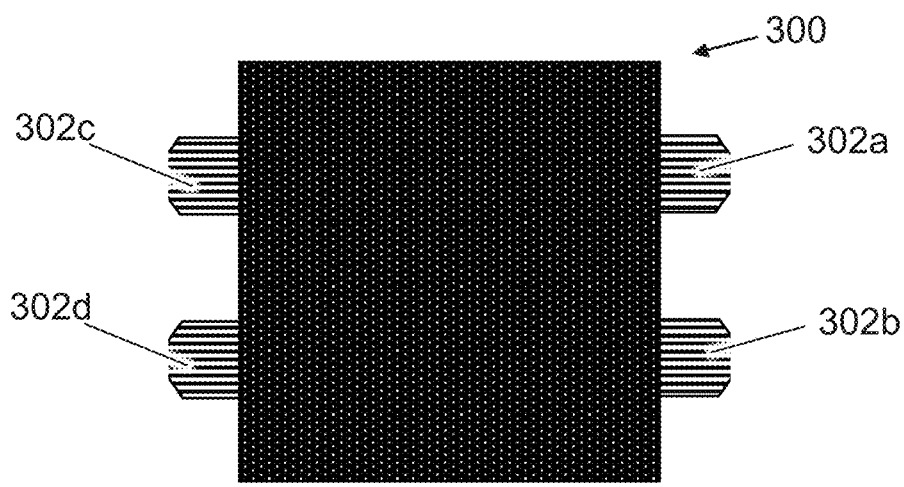
FIGS. 3A and 3B show two steps of a micro-transfer printing process.
Figure 3B:
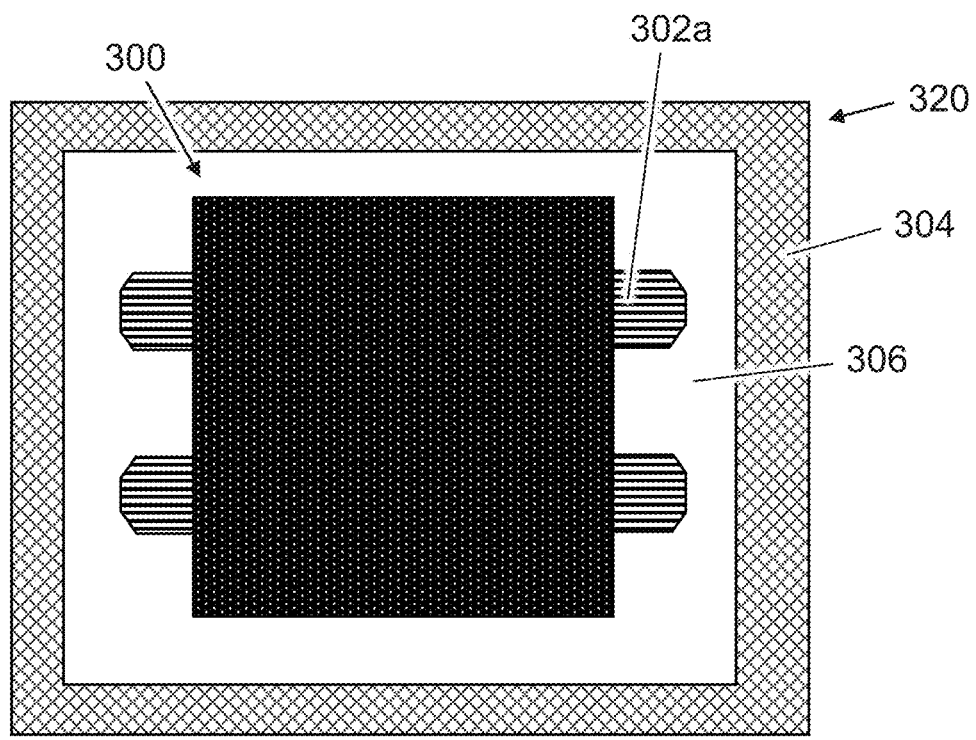

FIGS. 3A and 3B show two steps of a micro-transfer printing process. The device coupon 300 in FIG. 3A has been released and lifted away from the device wafer. As can be seen, fragments 302a-302b of the semiconductor tethers remain attached to the device coupon as the tethers break at a point distal to the coupon. The device coupon is then printed into a cavity 306 of a platform wafer 320, e.g. a silicon-on-insulator platform. The cavity 306 is formed in a device layer 304 of the wafer, and in this example extends down to a substrate of the wafer. Notably, the fragments of semiconductor tether remain once the device has been printed and so are observable e.g. by optical or electron microscopy.

Figure 4A:
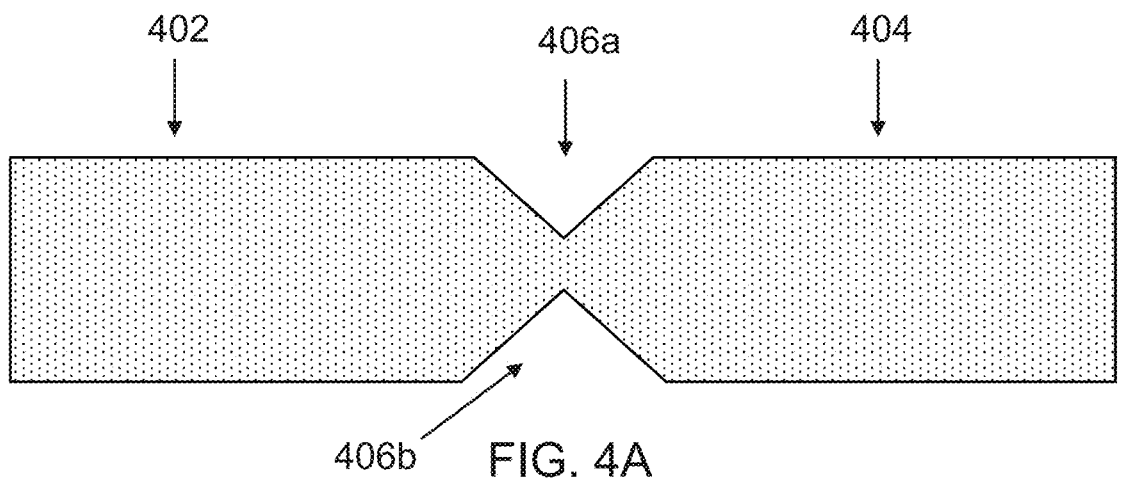
FIGS. 4A and 4B show, respectively, variant tether structures for use in a device wafer.
Figure 4B:
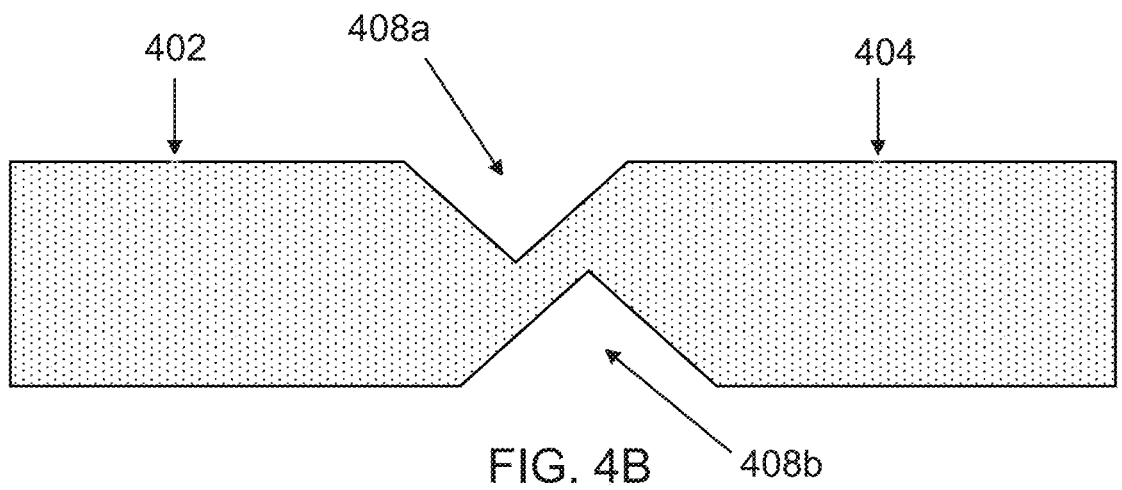

FIGS. 4A and 4B show, respectively, variant tether structures for use in a device wafer. The first tether structure, shown in FIG. 4A, comprises a first region 402 and a second region 404. For example the first region may extend from the device wafer, and the second region may extend from the device coupon. Between the first and second regions is a breaking region or breaking point, the shape of which is optimised for the MTP process e.g. is narrower than adjacent portions so as to be structurally weaker (although other parameters may be modified, e.g. the thickness of the tether at that point as compared to adjacent points). In this example an etch may be performed which is preferential in a direction perpendicular to the direction from the first to the second regions. In this example, this results in two triangular shaped etched regions 406a and 406b. In this example they are located opposite one another. FIG. 4B shows a second tether structure which shares features in common with the first (indicated by like reference numerals). Here an etch has been performed which is preferential in a direction which is at 45° from the extension of the tether. This results in two triangularly shaped etched regions 408a and 408b which are offset form one another in the direction from the first to the second regions.

Figure 5:
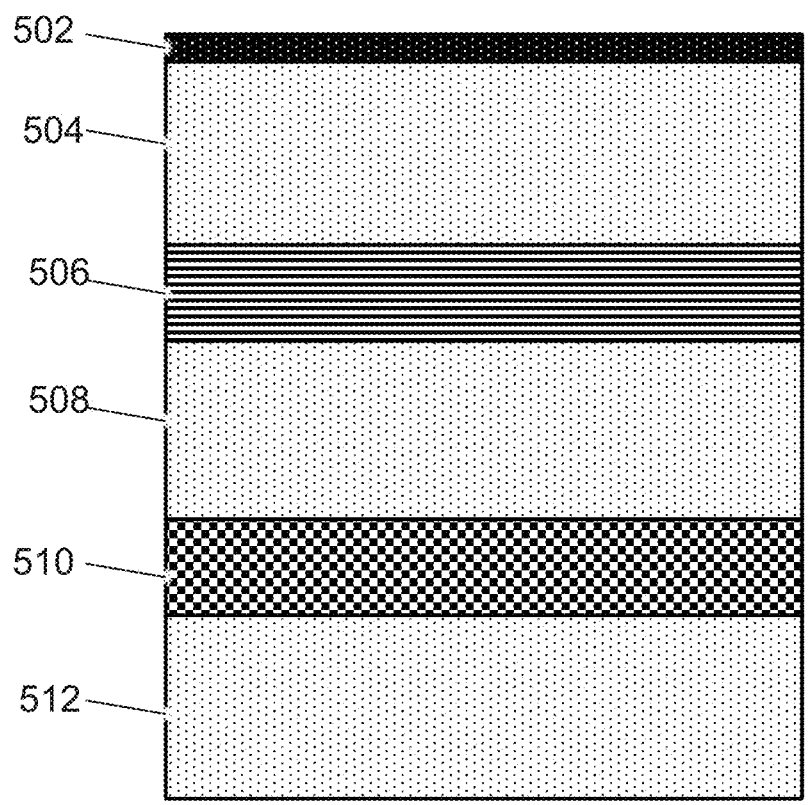
FIG. 5 shows a cross-sectional view of an initial device wafer before preparation.

FIG. 5 shows a cross-sectional view of an initial device wafer before preparation. The initial device wafer comprises: contact layer or layers 502, a first semiconductor layer 504 (e.g. p-InP), a second semiconductor layer 506 (e.g. a quaternary active layer), a third semiconductor layer (e.g. p-InP), an undercut etch layer 510 (also known as a sacrificial or release layer), and a host wafer 512.

Figure 6A:
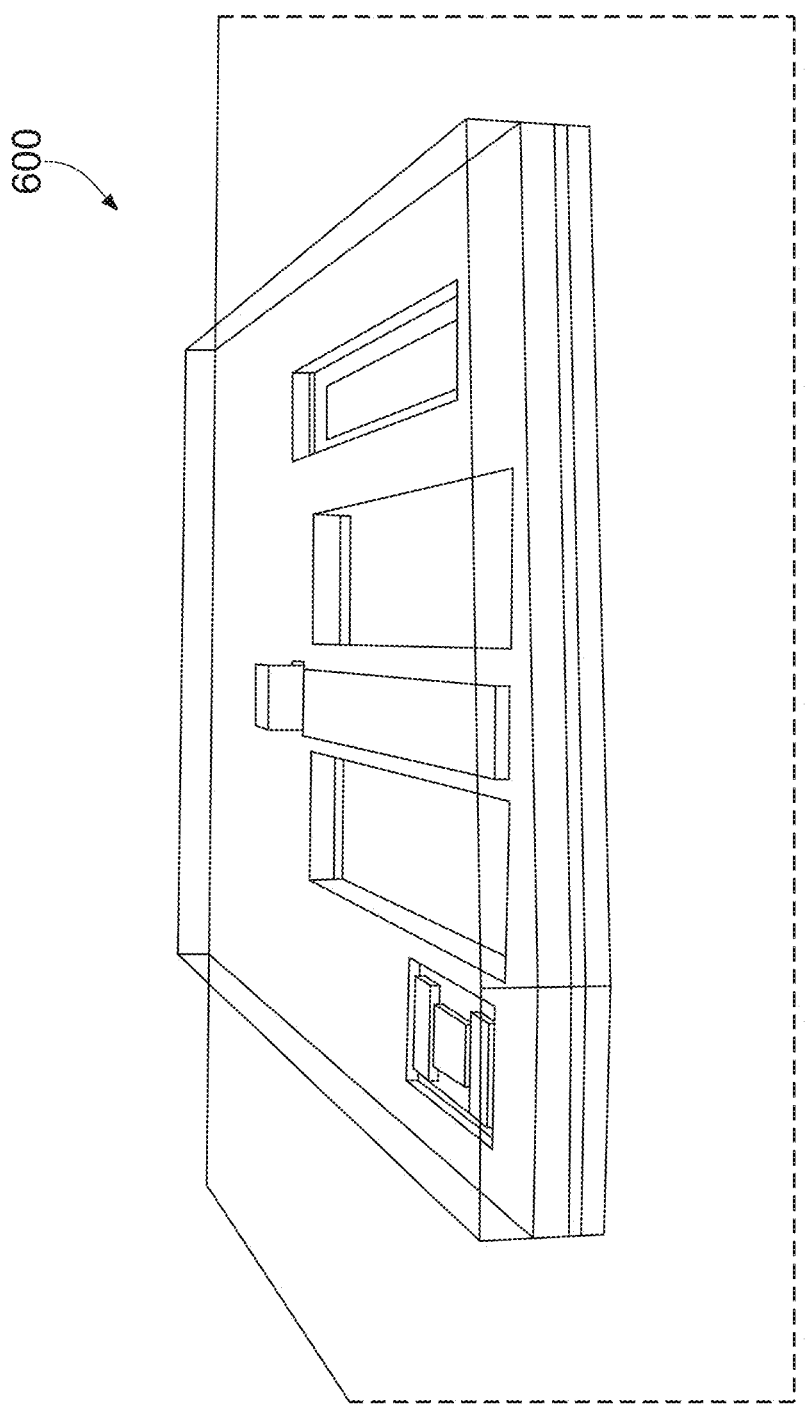
FIGS. 6A-18 show various steps of a method of preparing a device coupon.
Figure 6B:
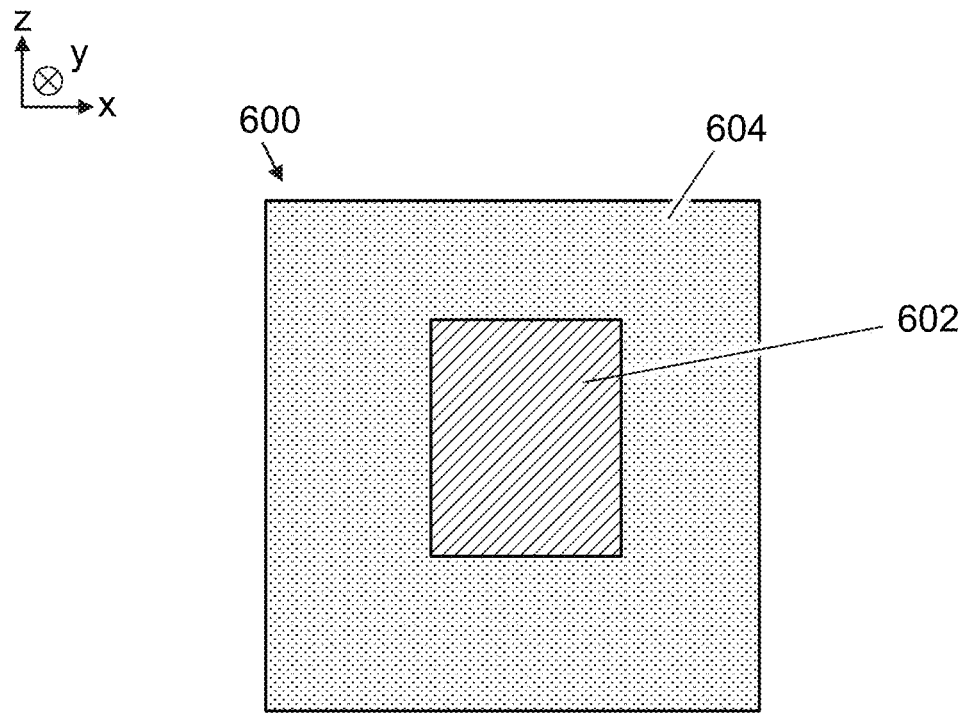
Figure 6C:
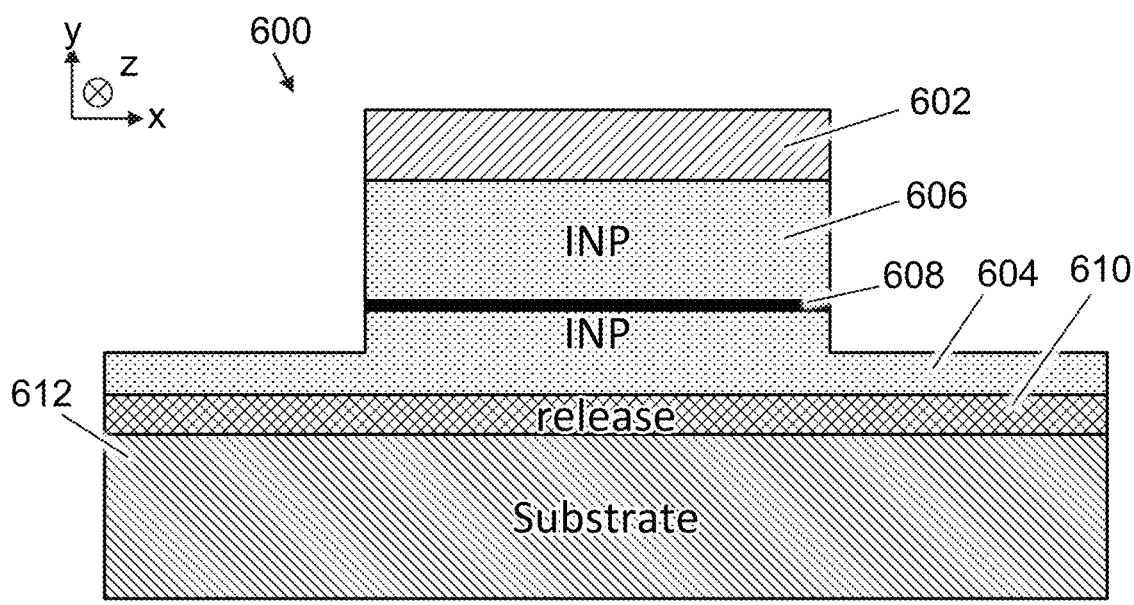

FIGS. 6A-18 show various steps of a method of preparing a device coupon. In a step the result of which is shown in FIG. 6A, the device coupon 600 is defined (e.g. etched, with any electronic components being provided such as contacts or electrodes) and then a facet etched on one lateral side of the device coupon. FIG. 6B shows the device coupon 600 from a top-down view, where an oxide layer 602 can be seen (which is left over from previous steps to define the device coupon). The device coupon is surrounded by a slab region of the third semiconductor layer 604 (in this instance). FIG. 6C shows a cross-section through the etched facet, where the first semiconductor layer 606, second semiconductor layer 608, and third semiconductor layer 604 can be seen. Beneath the third semiconductor layer, i.e. between the third semiconductor layer and the substrate 612 is release layer 610.

Figure 7A:
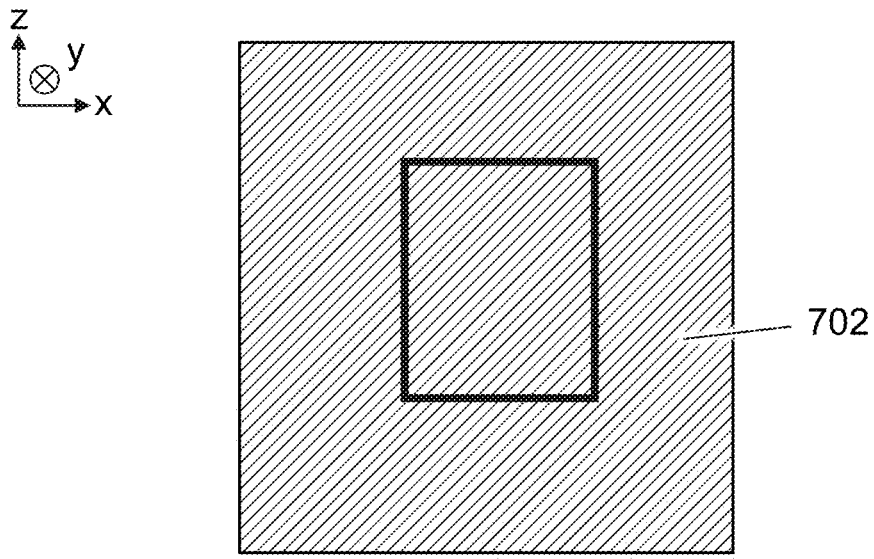
Figure 7B:
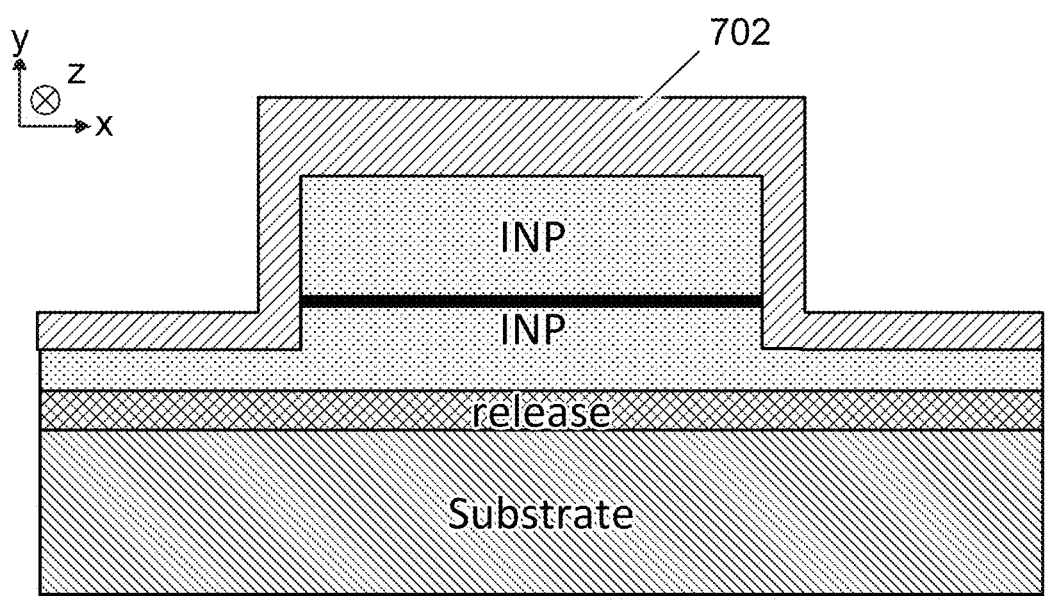
Figure 8A:
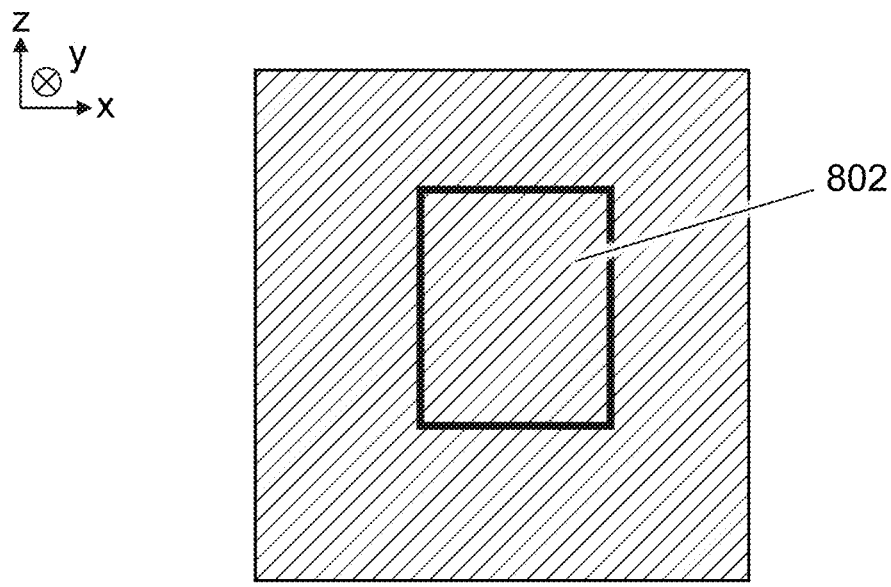
Figure 8B:
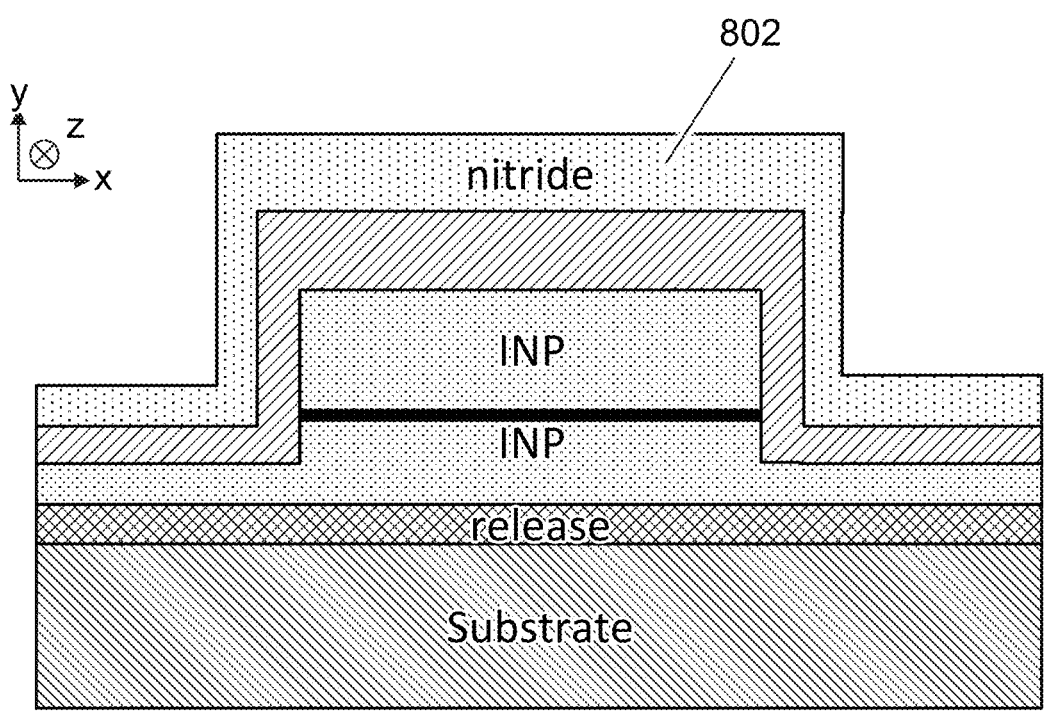
Figure 9A:
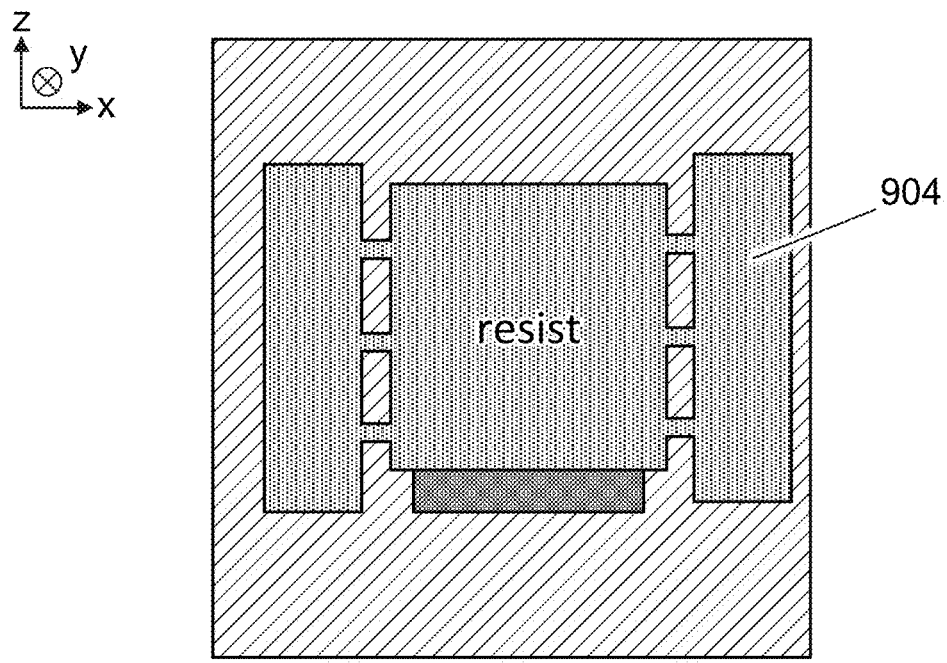
Figure 9B:
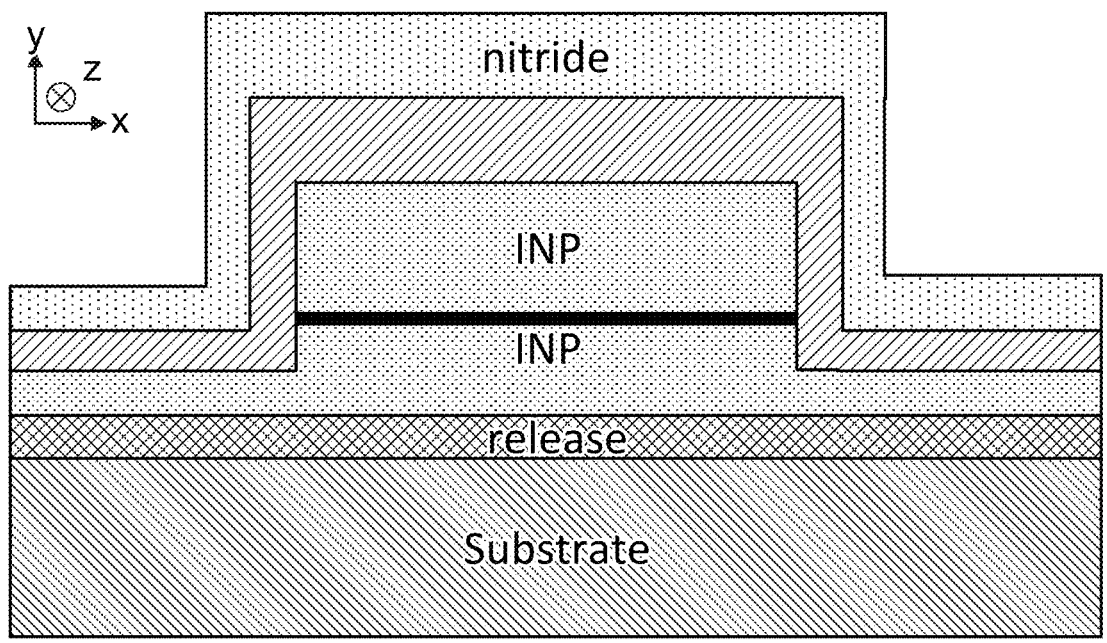
Figure 10A:
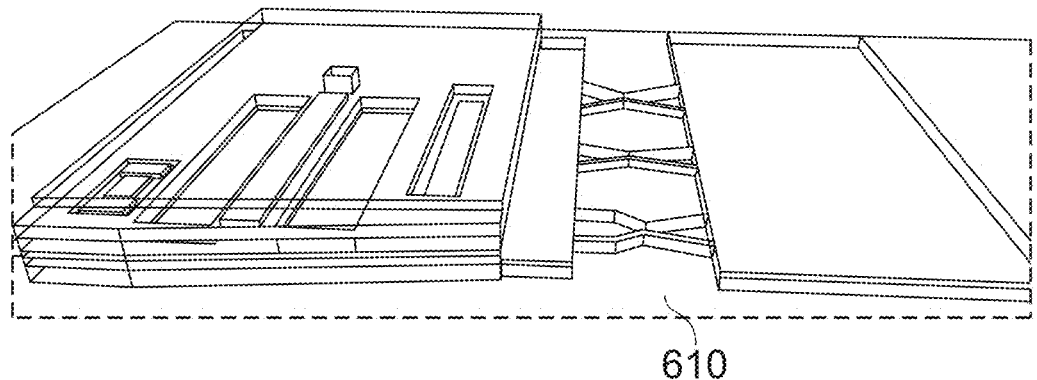
Figure 10B:
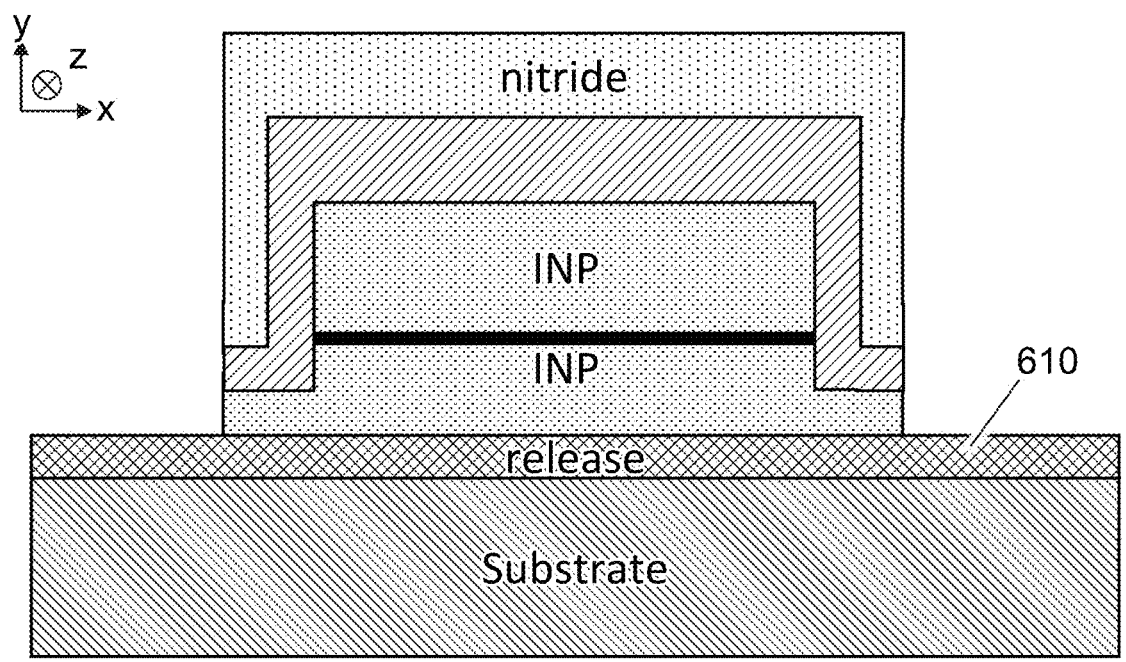
Figure 11A:
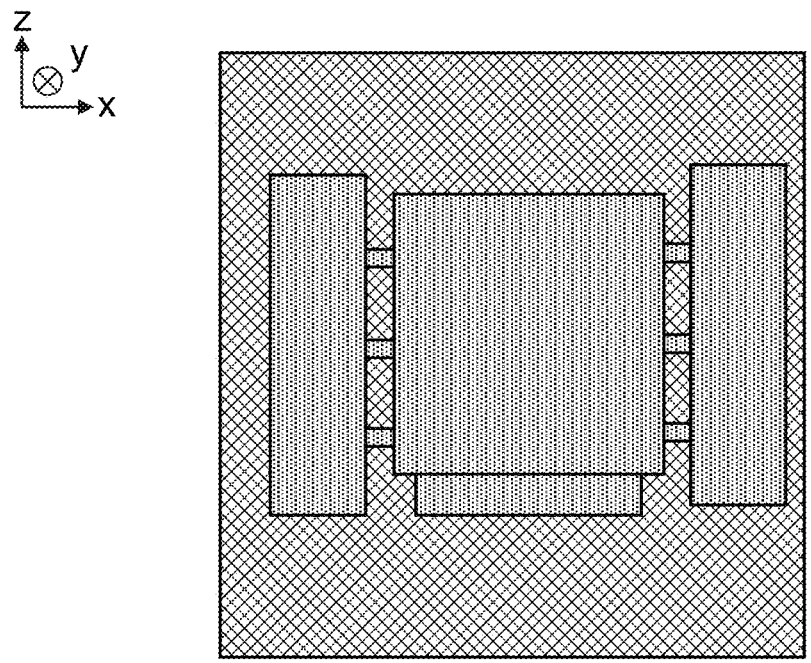
Figure 11B:
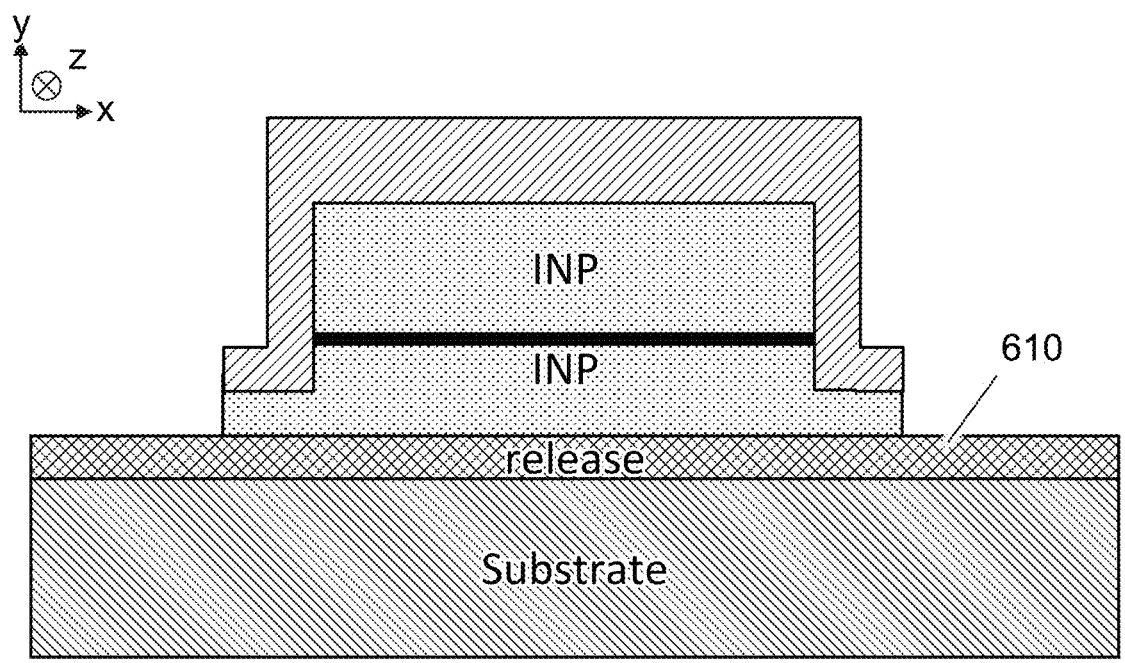
Figure 12A:
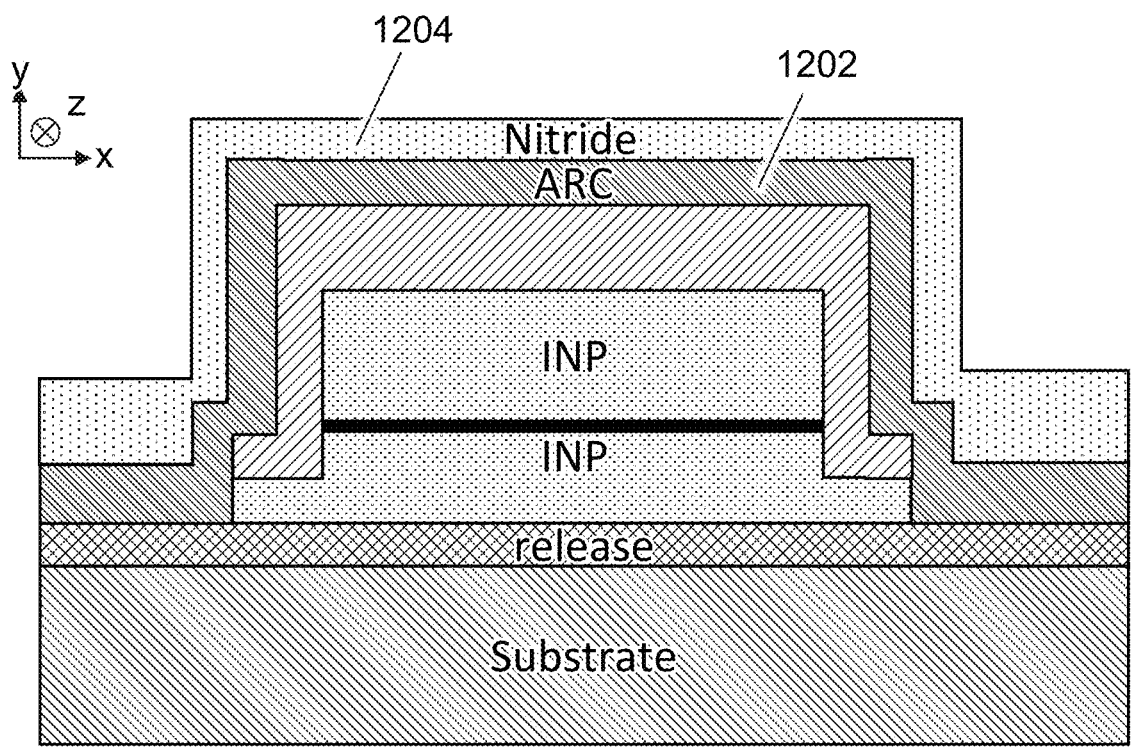
Figure 12B:
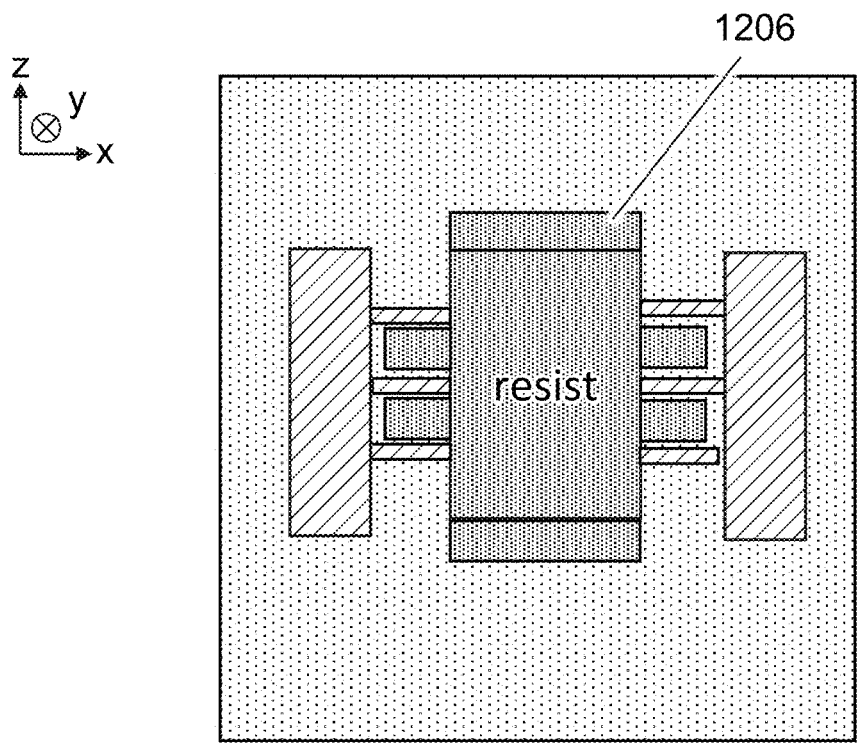
Figure 13:
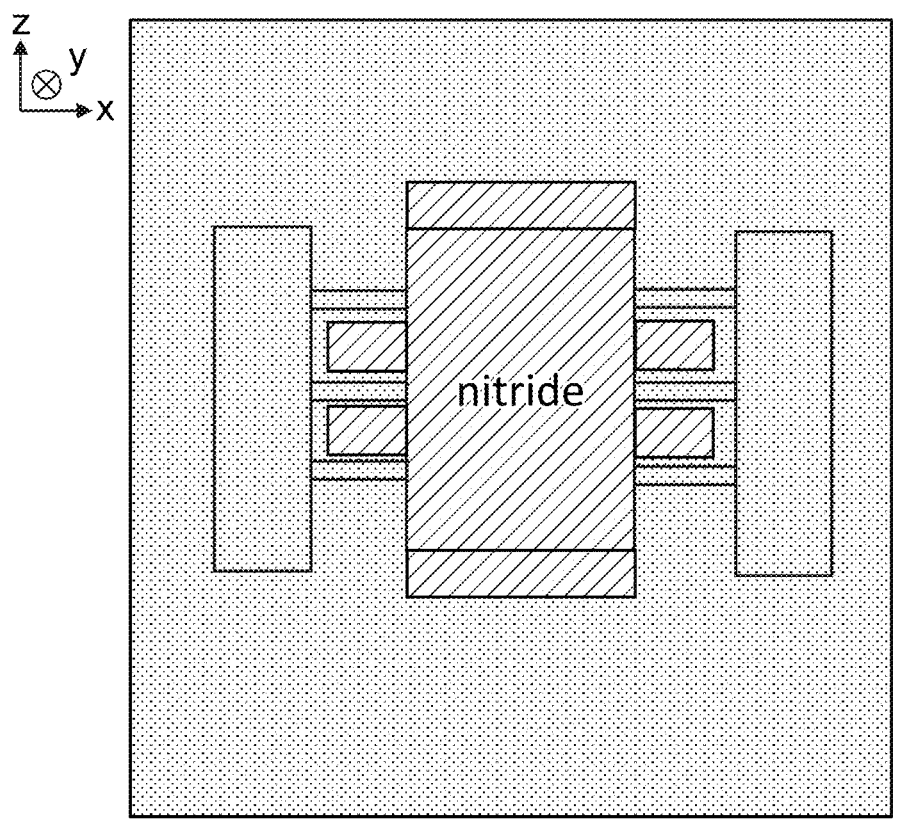

Next, in a step shown in FIGS. 7A (top-down view) and 7B (cross-section through facet), a thin layer of oxide 702 is deposited over the entire device and coupon so as to protect the facet. This oxide layer also functions as a first layer of an antireflective coating. FIGS. 8A (top-down view) and 8B (cross-section through the facet) show the result of a next step, where a nitride layer 802 is deposited for a hard mask. The nitride can be, for example, silicon nitride. A resist 904 is then spun coated onto the wafer and patterned to define the tethers and pillars which will be formed after an etch. A ledge exists on all corners of the device coupon asides from the facet edge. The resist mask is intentionally offset, which exposes the facet. This is shown in FIGS. 9A (top-down view) and 9B (cross-section through the facet). Next, in steps shown in FIGS. 10A (perspective) and 10B (cross-section through the facet), a first electric etch is performed followed by a semiconductor etch so that the release layer is exposed. A plasma ashing process (e.g. an Asher process) is then performed to remove the nitride hard mask and so clear the facet for further anti-reflective coating. The result of this is shown in FIGS. 11A (top-down view) and 11B (cross-section through the facet). Next a further anti-reflective 1202 coatings are provided for the facet which also protect the InP tether sidewalls. A nitride layer is then deposited to provide a hard mask for a lithography step (formation of grating and etching to the substrate). A resist 1206 is then provided used to pattern the nitride hard mask so as to define a grating (e.g. the periodic shape of the resist shown in FIG. 12B). The result of these steps is shown in FIGS. 12A (cross-section through the facet) and 12B (top-down view). An etch is then performed to the substrate to create the grating and the resist is removed, as shown in FIG. 13 (top-down view).

Figure 14A:
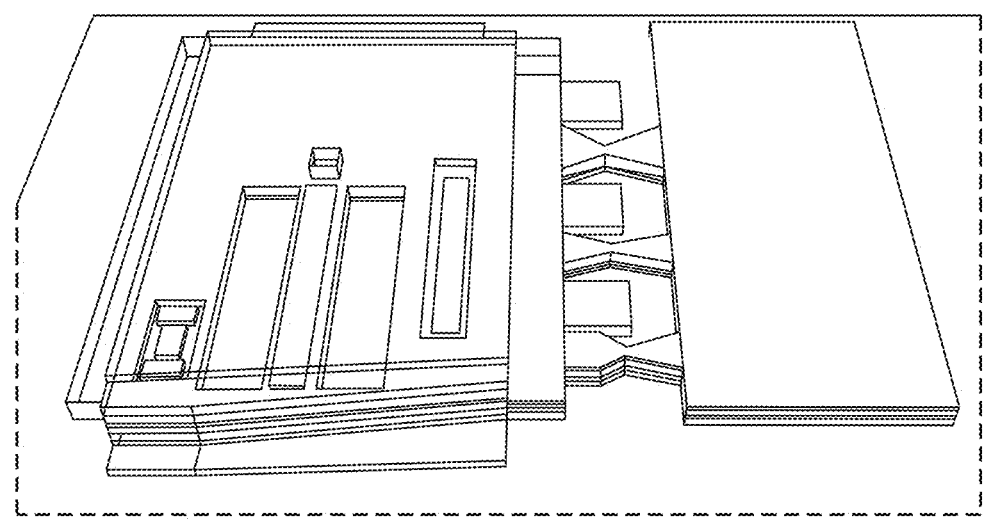
Figure 14B:
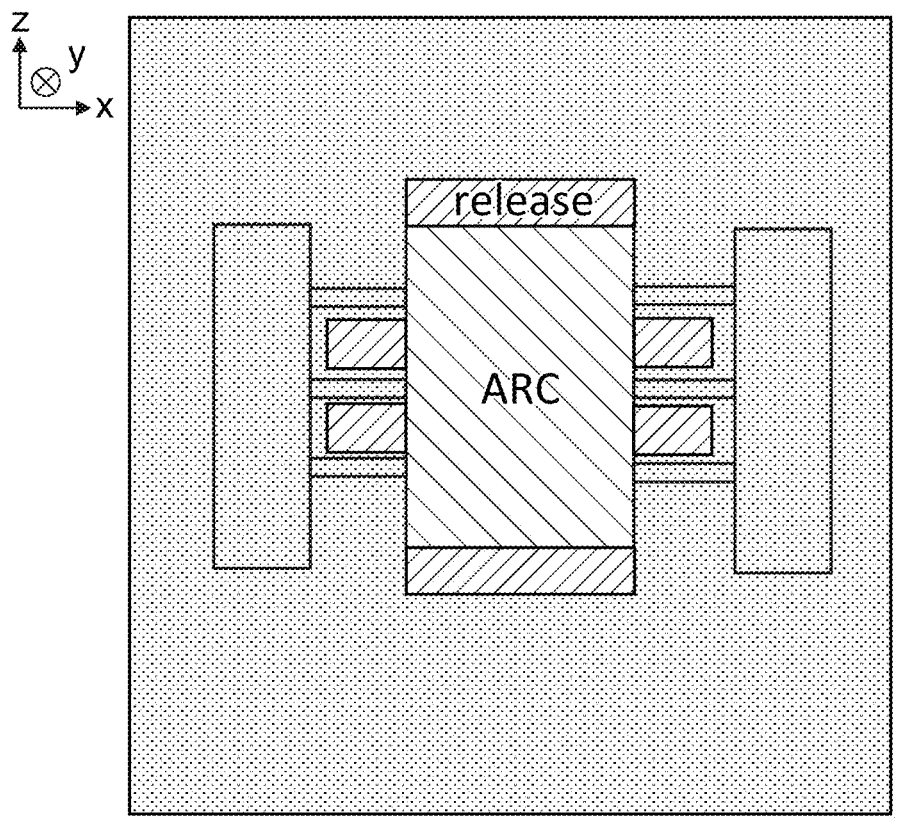
Figure 14C:
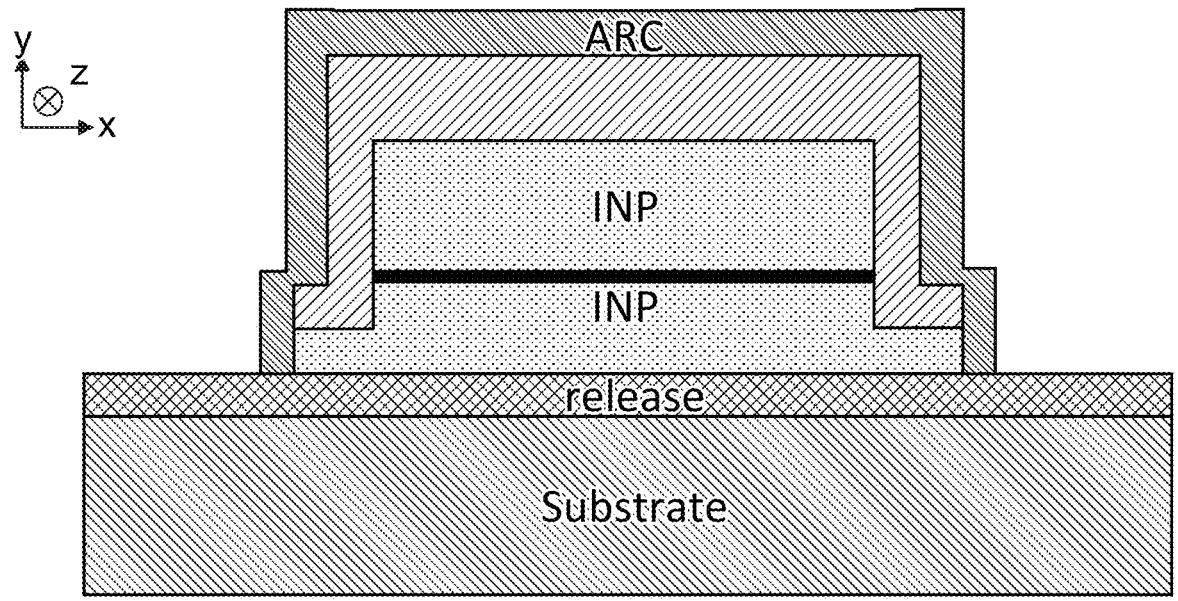

Once the etch has been performed down to the substrate, the exposed nitride layer is then etched via, for example, an Asher process to clean the facet and the top of the grating. This is shown in FIGS. 14A (perspective), 14B (top-down view), and 14C (cross-section through the facet). The initial InP tether thickness is around 1.4 µm. If the 500 nm release layer is etched and then the etch is then stopped, the tether thickness will be around 900 nm. If it decided that the tethers should be thinner, a longer etch into the substrate can be performed. If it is decided that the tethers should be thicker than 900 nm, the initial etch (in which the coupon is defined) is adjusted.

Figure 15:
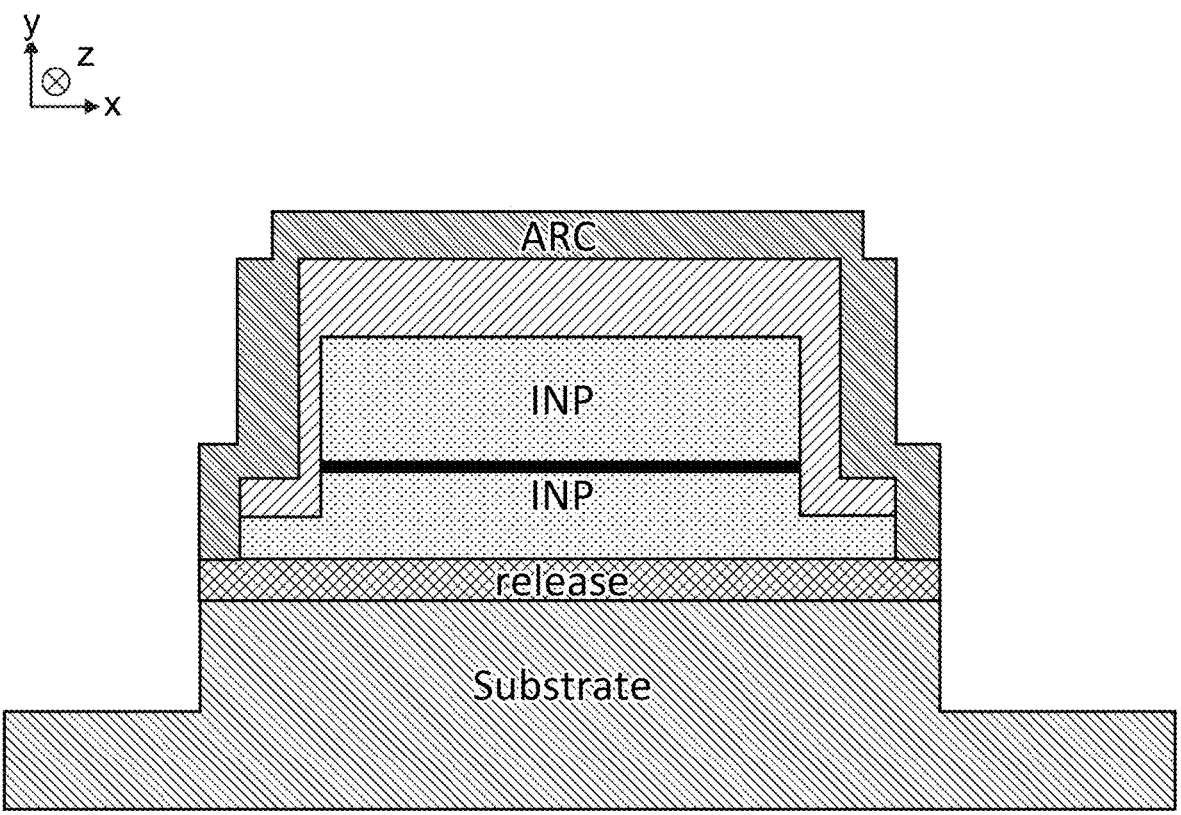

At this stage, the corners of the coupon may become exposed (as shown in FIG. 15) and the top of the tethers may be exposed to release etchant. However, the provision of an additional photoresist protection layer as per the present disclosure ensures that even if the corners are exposed the tethers will not be exposed to the release etchant. Therefore a ledge-less process can be provided where leakage is not of concern.

Figure 16A:
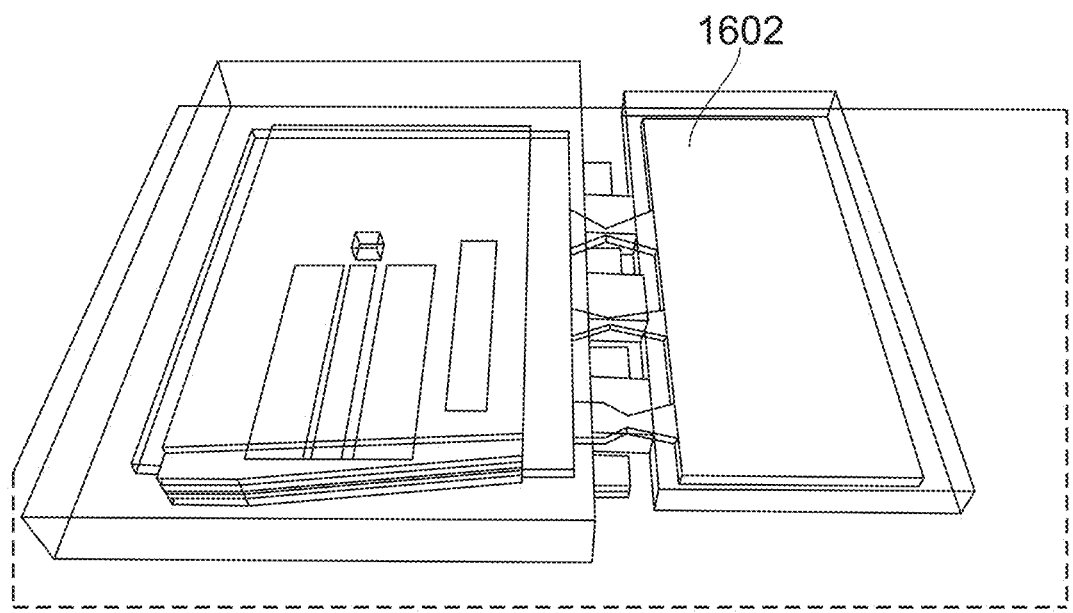
Figure 16B:
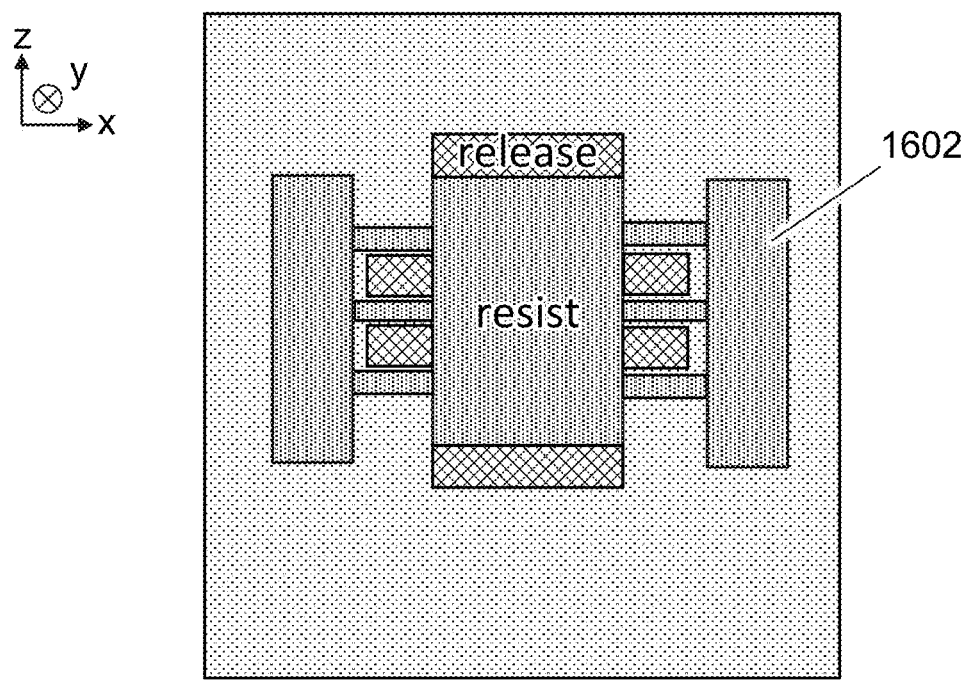
Figure 17A:
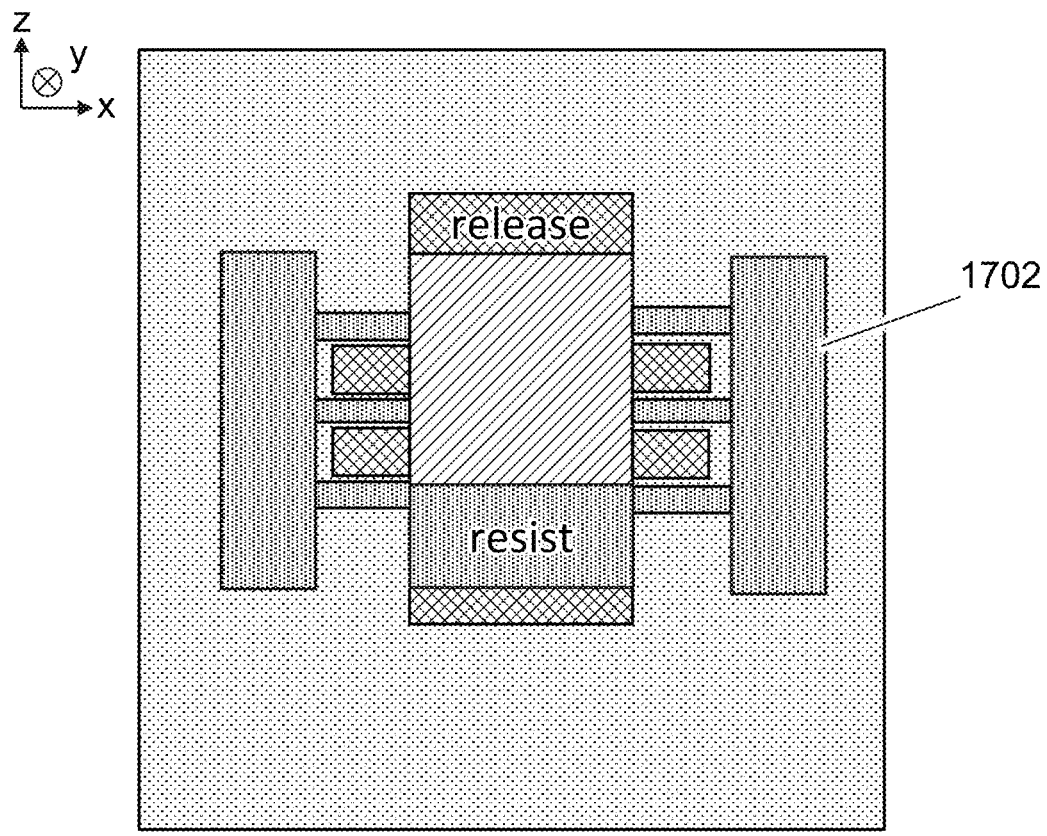
Figure 17B:
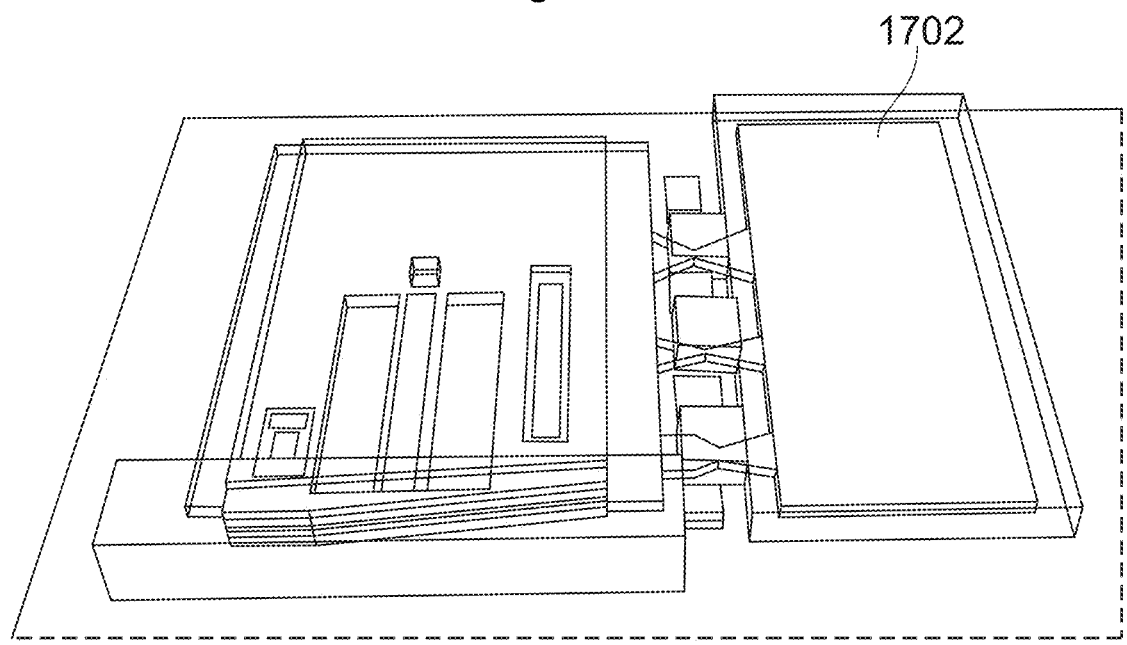
Figure 18:
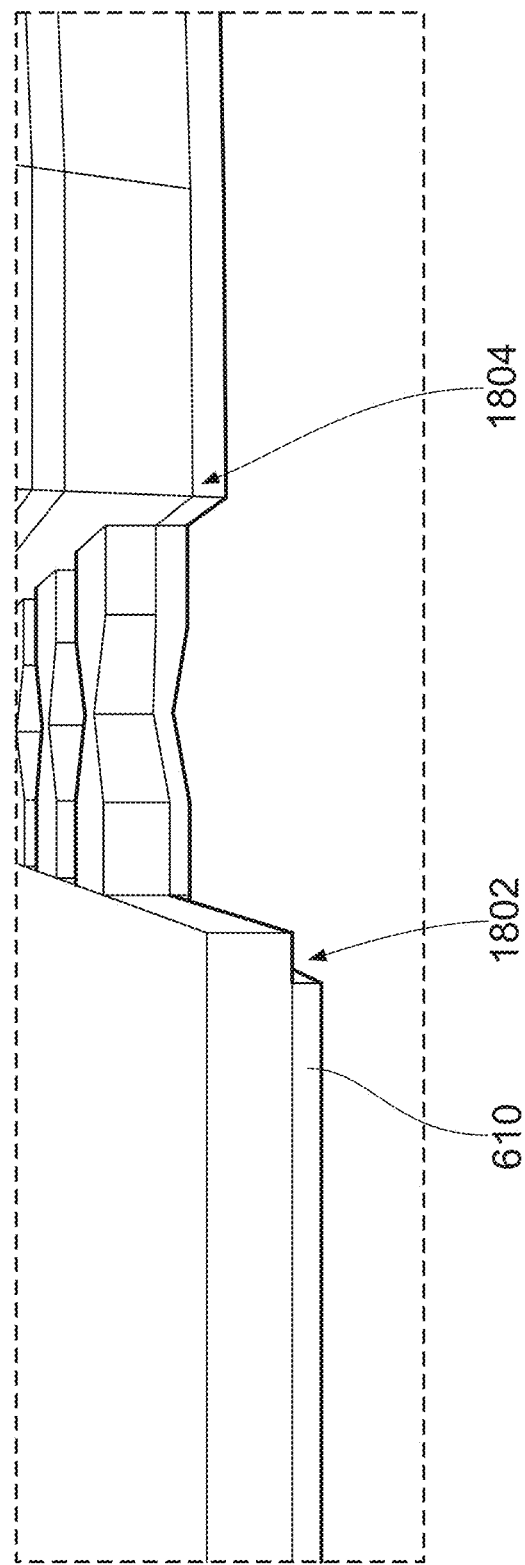

The coupon, tethers, and support pillars are then covered with resist 1602 as shown in FIGS. 16A (perspective) and 16B (top-down view). The coupon is now ready for release and use in a micro-transfer printing process. After release, the coupon can be cleaned with isopropyl alcohol (IPA) or acetone before deionized water (DI) to remove the resist. FIGS. 17A and 17B show an alternative to FIGS. 16A and 16B, where the resist 1702 is only applied to cover the facet and supports. FIG. 18 is a perspective figure showing the undercuts after release. As can be seen, the undercut 1804 under the coupon and tethers is a full undercut and so the device coupon and tethers do not directly contact the wafer. In contrast, the undercut 1802 on the remaining wafer is only a partial undercut so that the release layer 610 is still present.

Figure 19A:
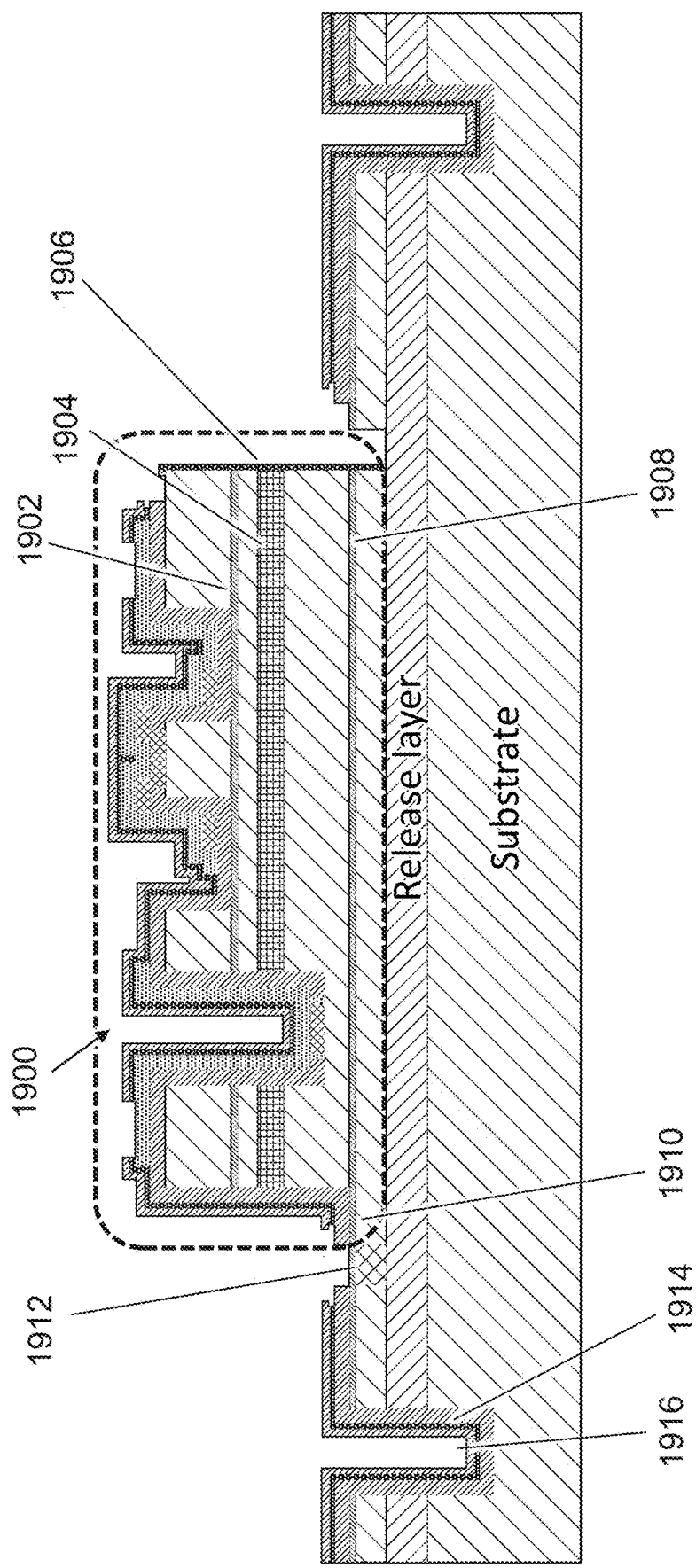
FIGS. 19A and 19B show, respectively, cross-sectional and top-down views of a variant device wafer.
Figure 19B:
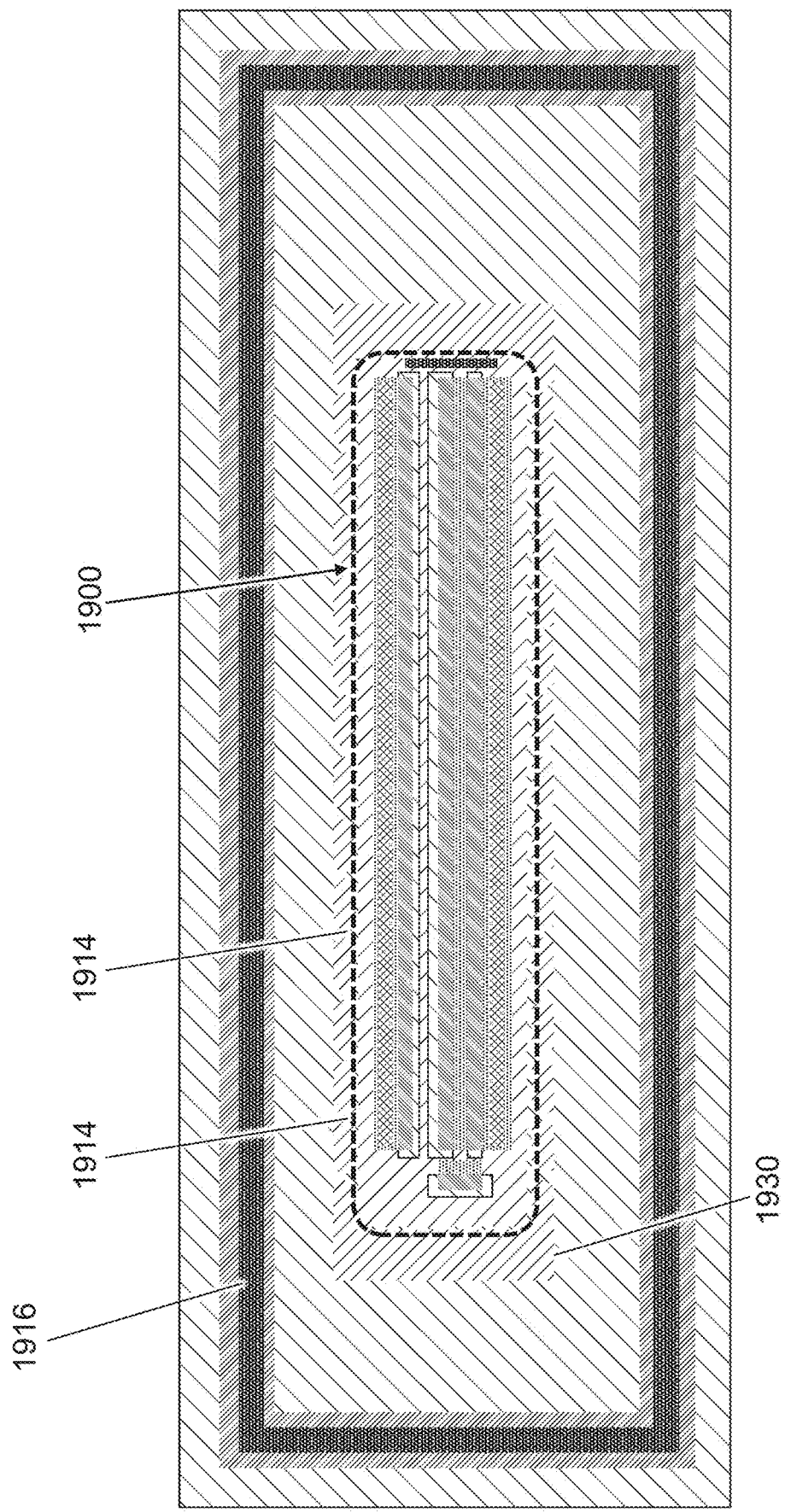

FIGS. 19A and 19B show, respectively, cross-sectional and top-down views of a variant device wafer. The device wafer includes a reflective semiconductor optical amplifier (RSOA) or another photonic device or device coupon 1900 denoted by the dashed region. As will be discussed in detail below, the device includes various semiconductor layers, electrical contacts, and other features. Of note is first etch stop layer 1902 which, as discussed in detail below, is used to improve the manufacturability of the device. The device 1900 also includes an active or gain region 1904 which is a layer of semiconductor. The facet 1906 of the device is coated in an antireflective coating. There is a second etch stop layer 1908 which, as also discussed in detail below, improves the manufacturability of the device. There is also a semiconductor tether layer 1910 which provides to tethers 1912 which connect the device 1900 to anchors 1914 formed in trenches 1916. In FIGS. 19A and 19B the release layer has not yet been removed, and so can be seen underneath the device. FIG. 19B shows the same device wafer as FIG. 19A but from a top-down perspective. The plurality of tethers 1914 (two labelled for clarity) can be seen around the periphery of the device 1900. The release layer 1930 can also be seen, as well as the trenches 1916 extending around the outer periphery of the coupon.

Figure 20I:
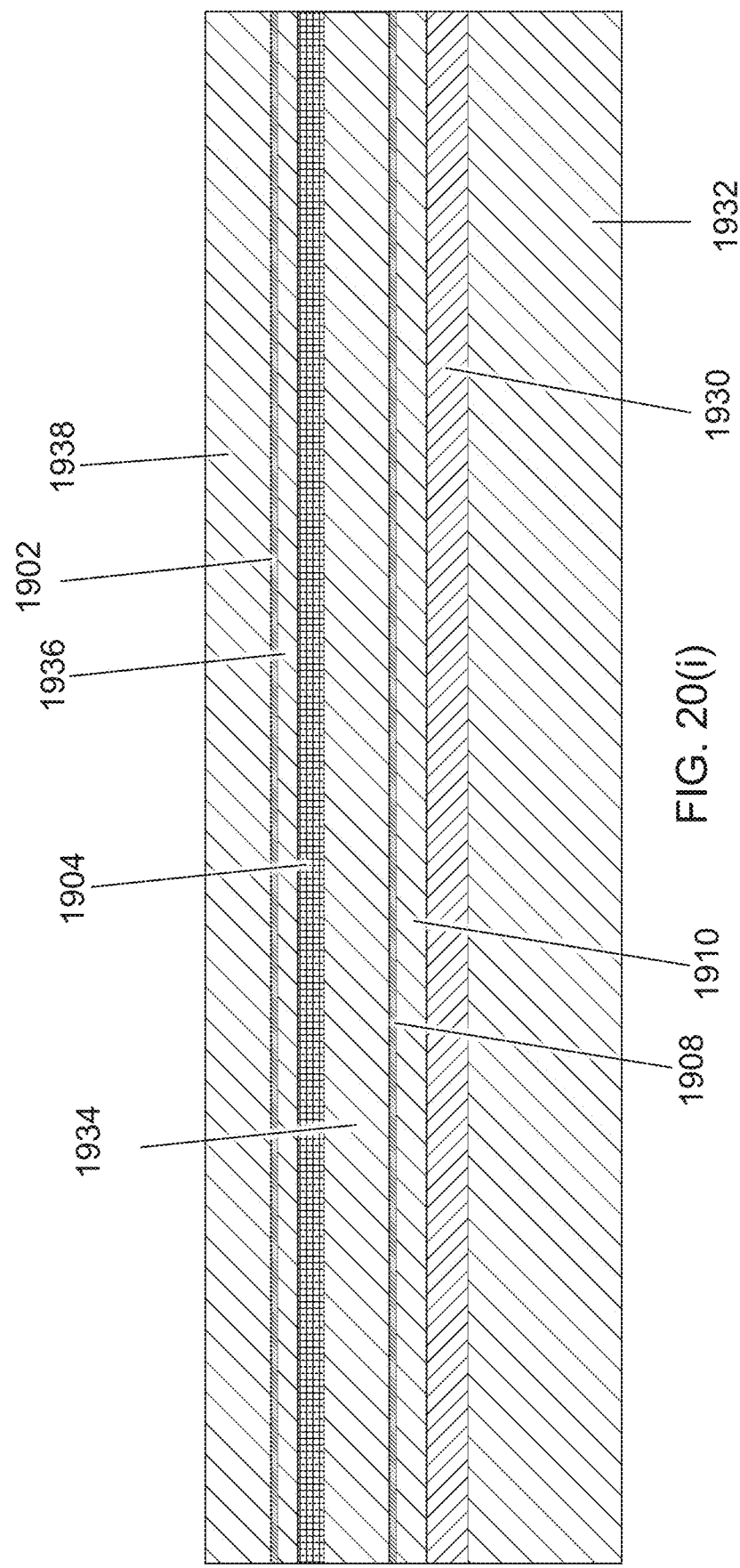
FIGS. 20(i) to 20(xxiii) show various steps of a method of preparing the device coupon of FIGS. 19A and 19B.
Figure 20:
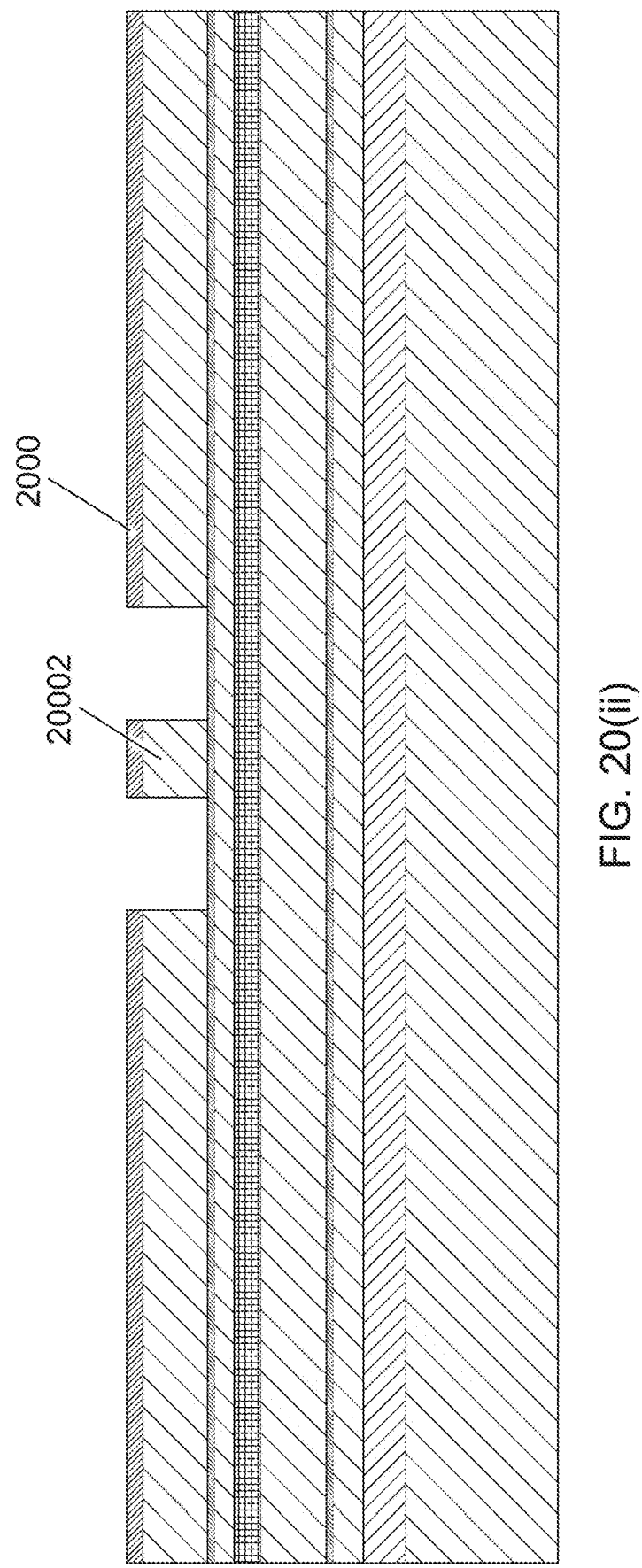
Figure 20:
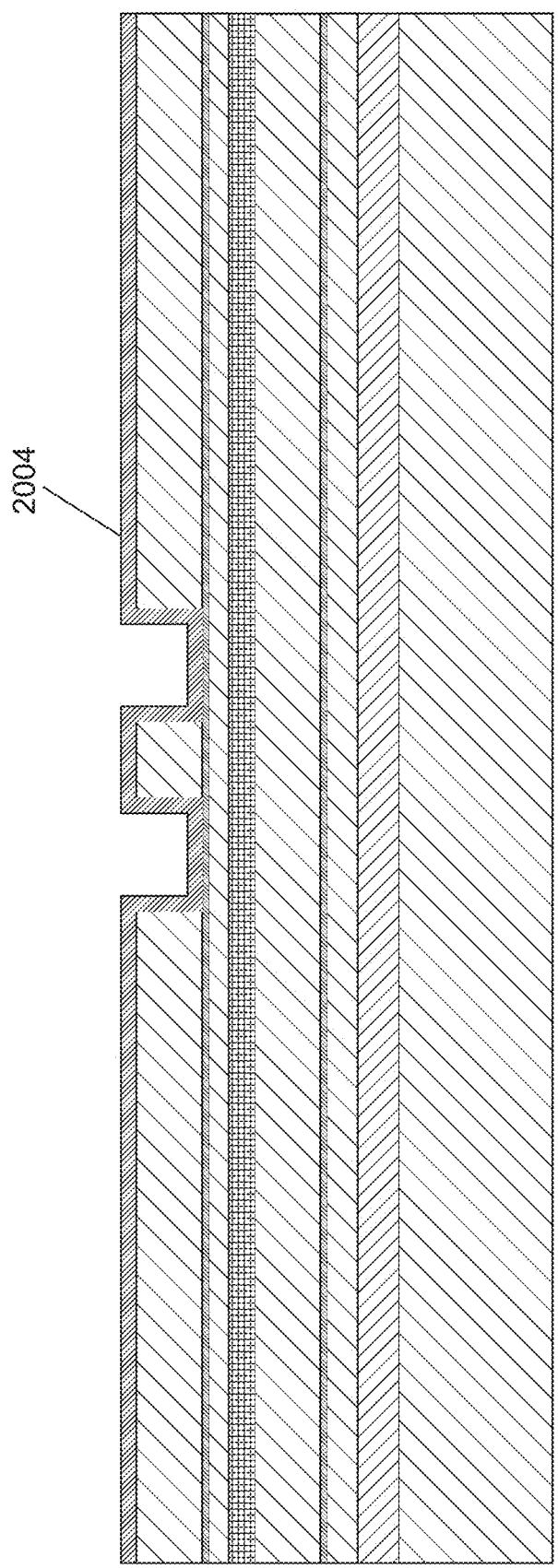
Figure 20V:
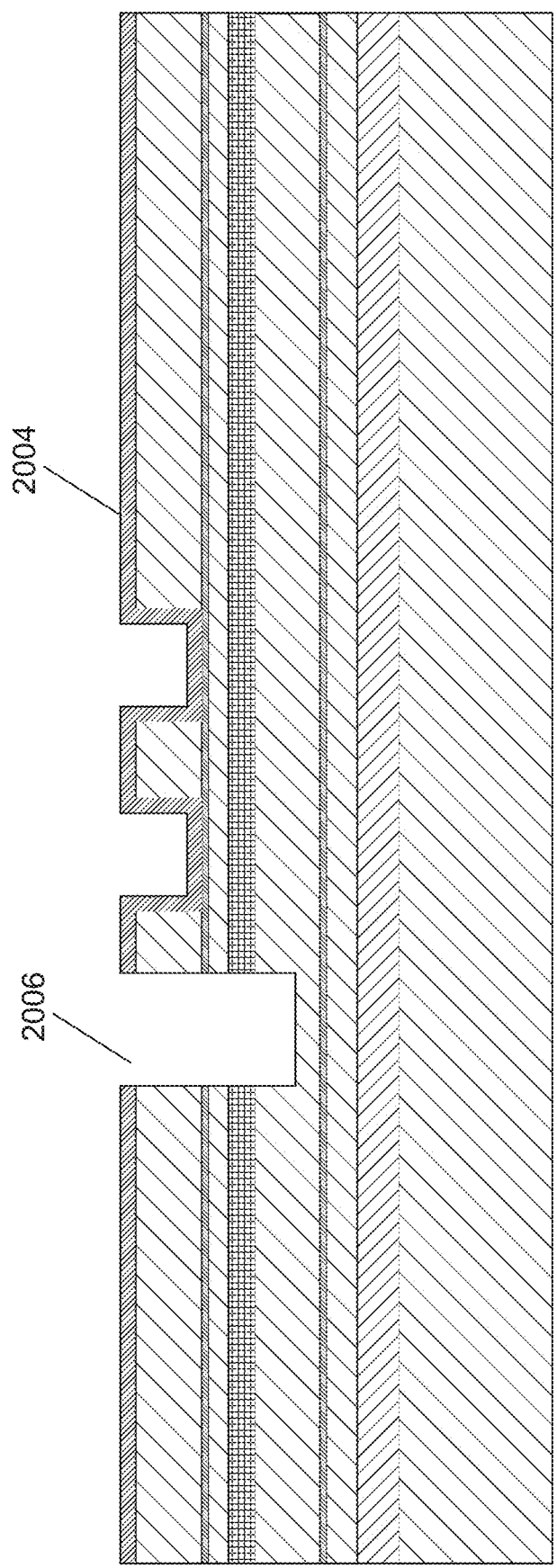
Figure 20:
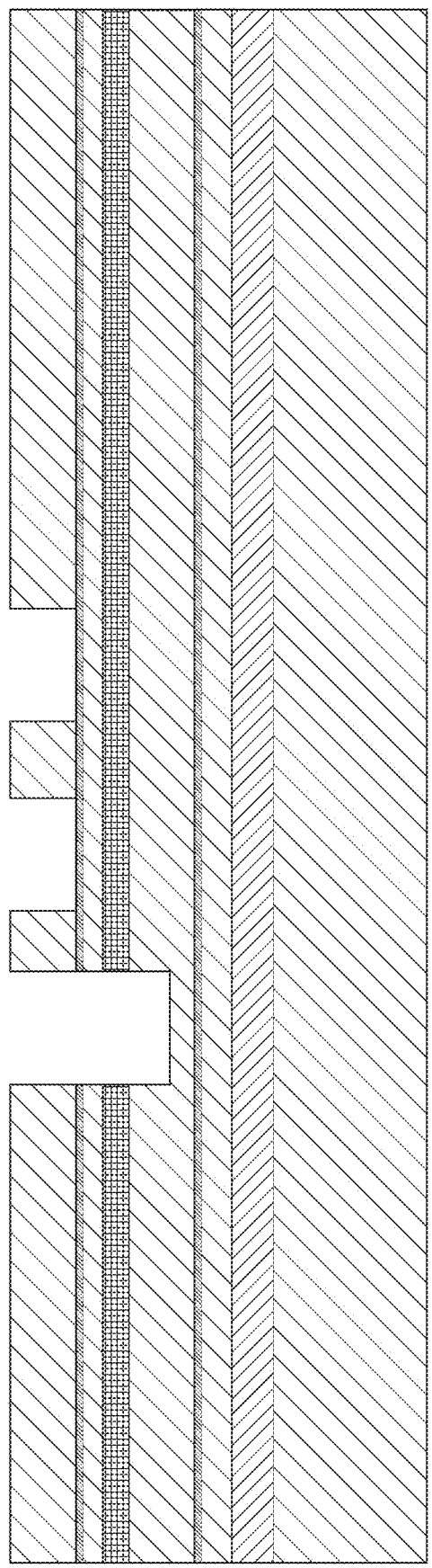
Figure 20:
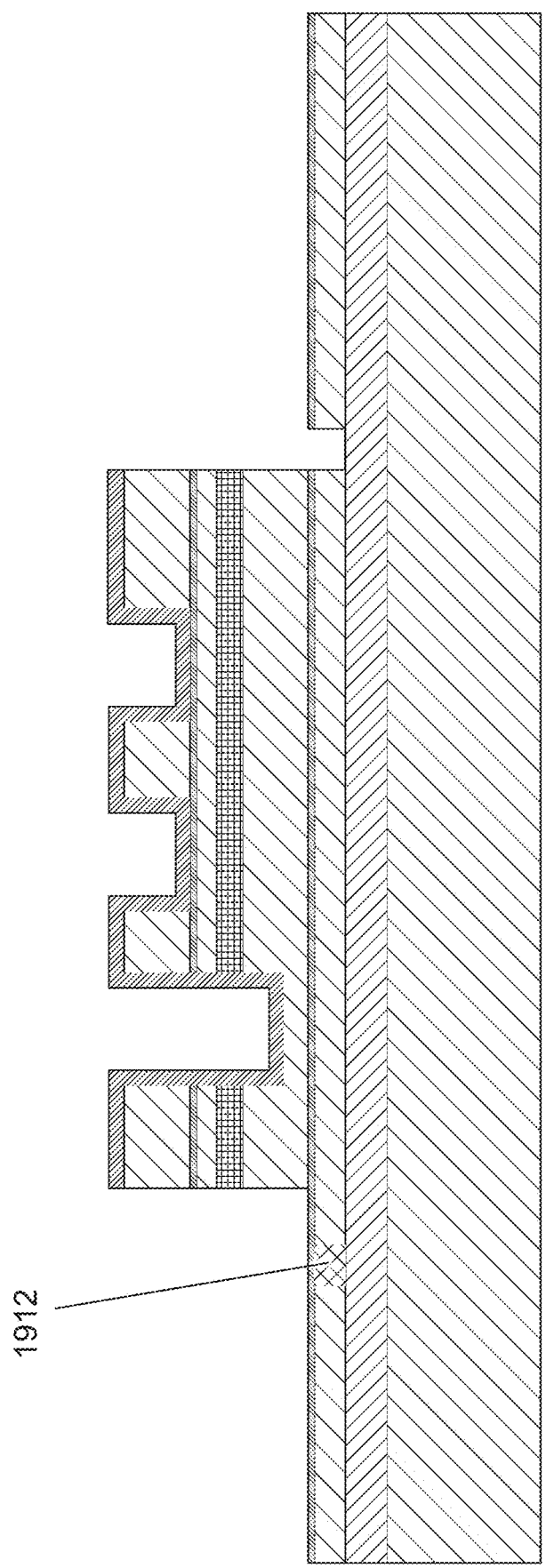
Figure 20X:
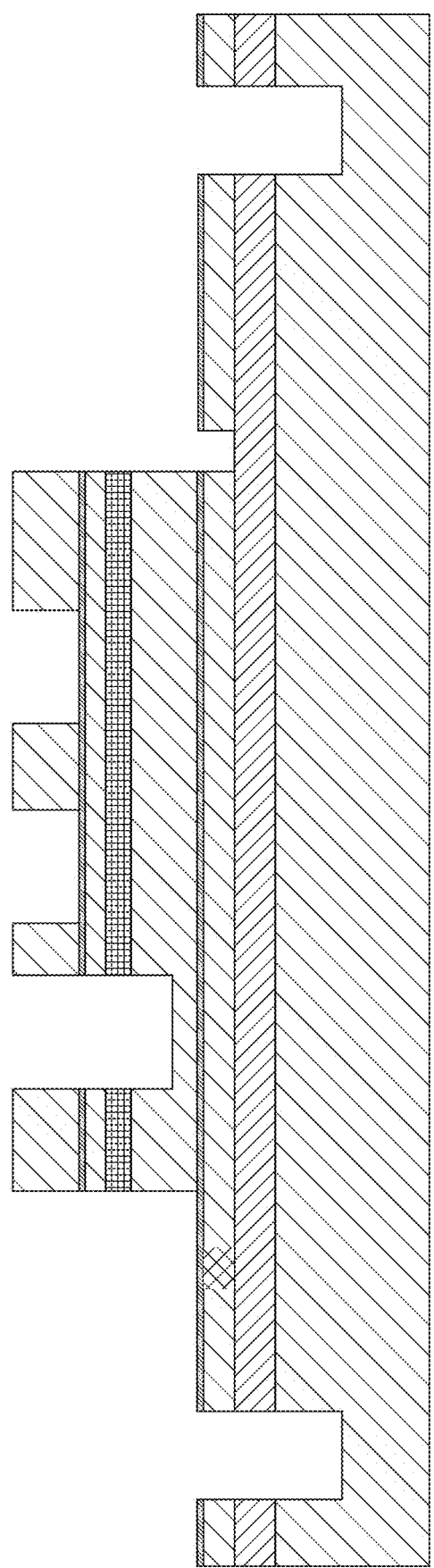
Figure 20:
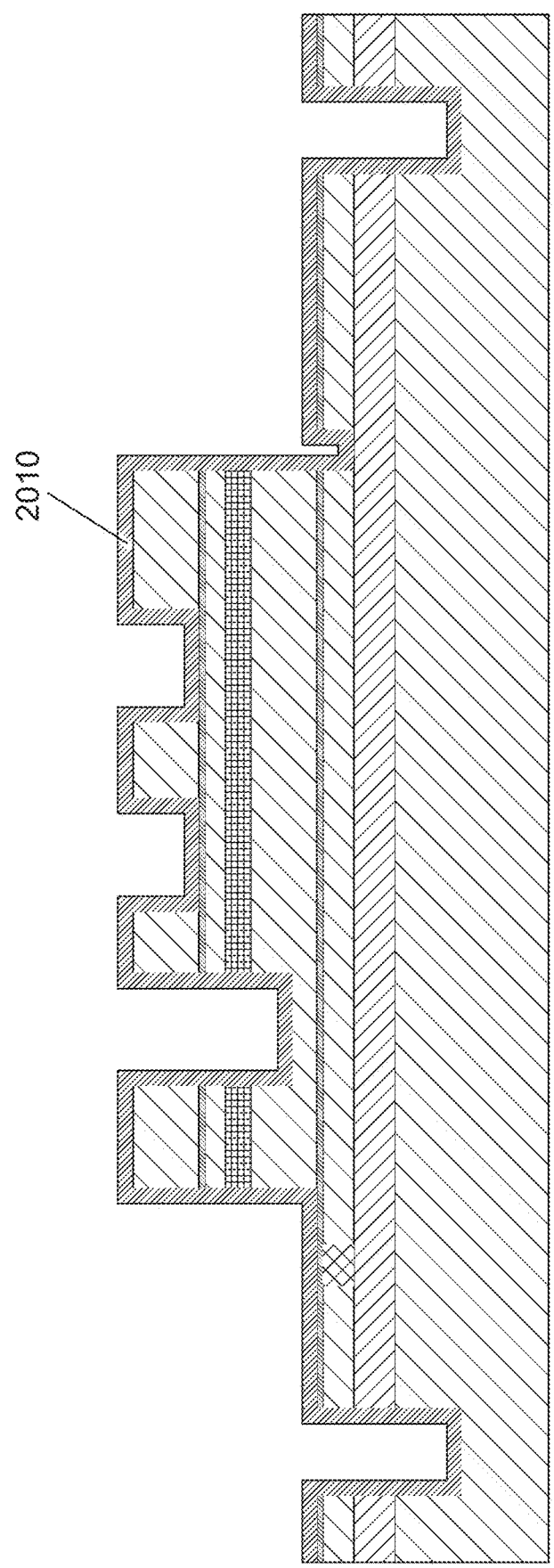
Figure 20:
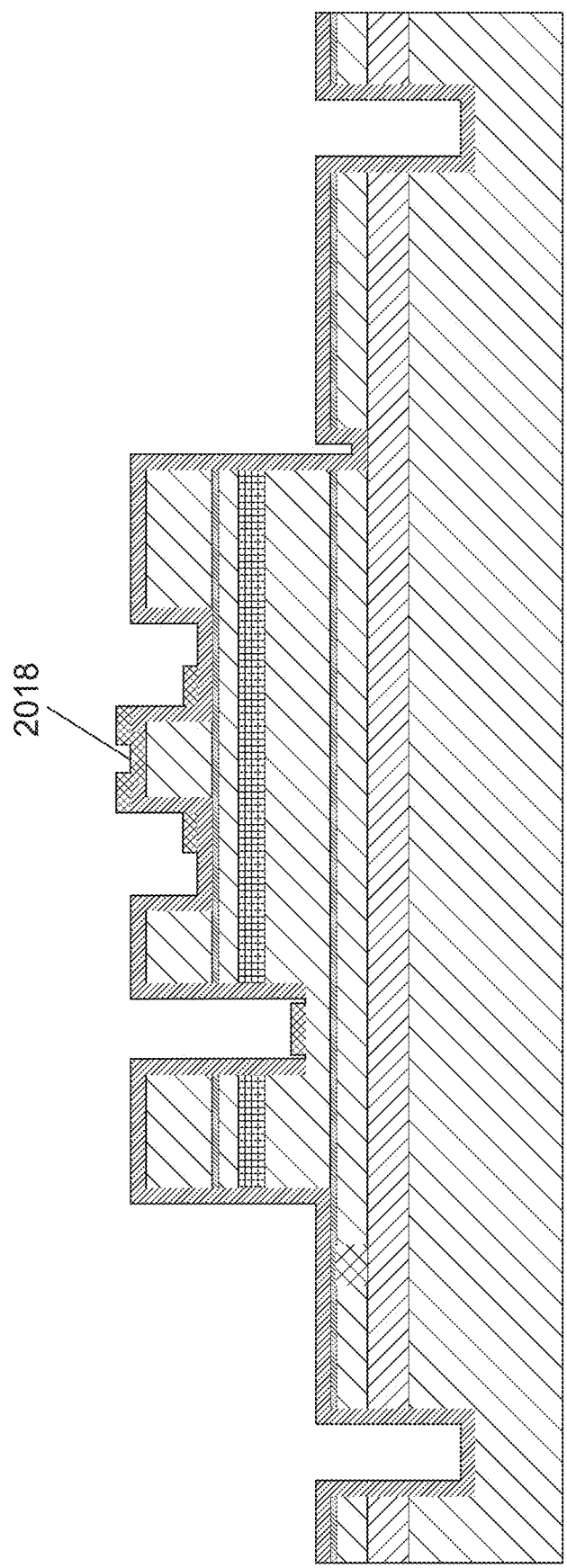
Figure 20:
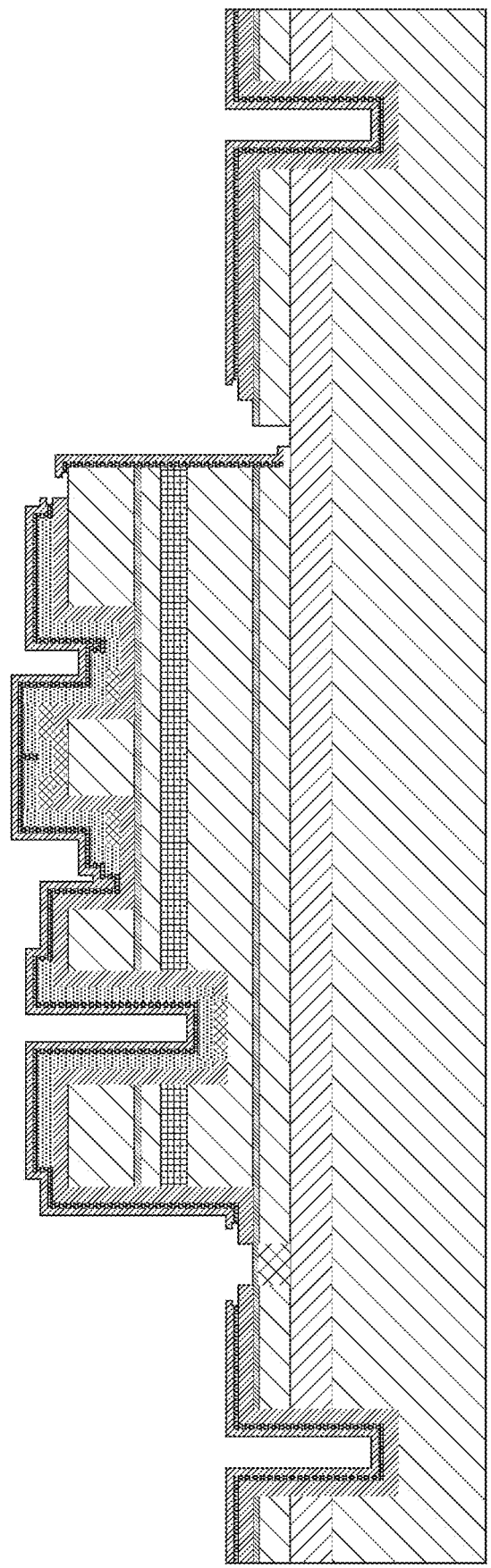

FIGS. 20(*i*) to 20(*xxvi*) show various steps of a method of preparing the device coupon of FIGS. 19A and 19B. In FIG. 20(*i*), an initial epitaxial wafer is provided. The initial epitaxial wafer includes, for example and in bottommost to uppermost layer, a substrate 1932, release layer 1930, tether layer 1910, second etch stop layer 1908, first intermediate semiconductor layer 1934, active or gain layer 1904, second intermediate semiconductor layer 1936, first etch stop layer 1902, and upper semiconductor layer 1938. The layers may have thicknesses as follows: substrate 1932—350,000 nm; release layer 1930—500 nm; tether layer 1910—500 nm; second etch stop layer 1908—20 nm; first intermediate semiconductor layer 1934—1500 nm; active or gain layer 1604—400 nm; second intermediate semiconductor layer 1936—1500 nm; first etch stop layer 1902—20 nm; and upper semiconductor layer 1938—1900 nm. Next, as shown in FIG. 20(*ii*), a hard mask 2000 is patterned onto the epitaxial wafer and a ridge 2002 is etched (via either a dry or wet etch) to the first etch stop. The hard mask is then stripped off, as shown in FIG. 20(*iii*). A new hard mask 2004 is then deposited over the wafer. The result of this is shown in FIG. 20(*iv*). The hard mask 2004 is then patterned and an etch, in this example a dry etch, is performed so as to expose a surface of the first intermediate semiconductor layer 1934 (also referred to as the n-doped layer) as shown in FIG. 20(*v*). This etch provides a via 2006 which is subsequently used to make the n-contact.

Next, as shown in FIG. 20(*vi*), the hard mask 2004 is then stripped and then a further hard mask 2008 is deposited as shown in FIG. 20(*vii*). This further hard mask is patterned and an etch (either wet or dry) is performed down to the second etch stop 1908. This etch defines the height of the resulting tether layer 1910. The result is shown in FIG. 20(*viii*). A self-aligned etch is then performed, which defines the facet of the device coupon and also the tethers surrounding the device (as shown in FIG. 19B), with the structure shown in FIG. 20(*ix*) resulting. The use of the second etch-stop in this step allows the tethers to be formed of semiconductor with a thickness accuracy limited only by variations during epitaxial growth (typically less than 10%). Next, in a step shown in FIG. 20(*x*), the trenches 1916 are etched into the wafer which provides the anchors discussed previously. The hard mask 2008 is then stripped as also shown in FIG. 20(*x*). A dielectric layer 2010, for example formed of silicon dioxide, is then deposited over the wafer as shown in FIG. 20(*xi*). This dielectric layer also lines the trenches, which ensures that the release layer etchant is contained and the mechanically weak points are always the semiconductor tethers. An n-contact opening 2012 is then formed in a part of the dielectric layer 2010 within the via for the n-contact, thereby exposing an upper surface of the first intermediate semiconductor layer 1934. This is shown in FIG. 20(*xii*). The n-contact 2014 is then deposited as shown in FIG. 20(*xiii*). Next, as shown in FIG. 20(*xiv*), a portion of the dielectric 2010 is etched away to provide a p-contact opening 2016 and expose an upper surface of the upper semiconductor layer 1938. The p-contact 2018 is then deposited as shown in FIG. 20(*xv*).

Next, routing metal 2020 is deposited and etched as shown in FIG. 20(*xvi*). After this, in a step shown in FIG. 20(*xvii*), the dielectric is etched to clear the facets and tethers. An antireflective coating 2022 is then deposited over the wafer. This result of this is shown in FIG. 20(*xviii*). The antireflective coating can be made from a mixture of SiN and $SiO_2$, for example $SiO_2$:SiN:$SiO_2$, or can be formed only of SiN. The thickness of the coating is a function of the targeted wavelength. A hard mask coating 2024 is then applied, to protect the anti-reflective coating 2022 as shown in FIG. 20(*xix*). The hard mask coating 2024 is then patterned. A wet etch is then performed to remove unmasked portions of the anti-reflective coating 2022 and an undercut etch (which may be part of the same wet etch) is used to remove the foot on the facet as shown in FIG. 20(*xx*). The hard mask coating 2024 present on the facet is then removed as shown in FIG. 20(*xxi*). Vias are then opened through the hard mask coating 2024 and anti-reflective coating 2022 to the routing metal as shown in FIG. 20(*xxii*). When the device coupon is intended for use, the release layer is etched away, as shown in FIG. 20(*xxiii*).

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

| List of features | |
|---|---|
| 100, 200 | Device wafer |
| 102, 202, 502 | Contact layers |
| 104, 206, 208, 504 | p-InP |
| 106, 210, 506 | Quaternary active |
| 108, 212, 508 | p-InP |
| 110, 214 | Support pillar |
| 112, 204 | Dielectric protection |
| 114, 218 | Air gap |
| 116, 216, 512 | Substrate |
| 118a-d, 220a-d | Tether |
| 190, 290 | Device coupon |
| 300 | Release device coupon |
| 302a-302d | Tether fragment |
| 304 | Device layer |
| 306 | Cavity |
| 320 | Host substrate |
| 402 | First end of tether |
| 404 | Second end of tether |
| 406a, b 408a, b | Triangular etched region |
| 510 | Undercut etch layer |
| 600 | Device coupon |
| 602 | Oxide |
| 604 | Lower semiconductor layer |
| 606 | Upper semiconductor layer |
| 608 | Active layer |
| 610 | Release layer |
| 612 | Substrate |
| 702 | Protective oxide layer |
| 802 | Nitride hard mask |
| 904 | Resist |
| 1202 | Antireflective coating |
| 1204 | Nitride hard mask |
| 1206 | Resist |
| 1602 | Resist |
| 1702 | Resist |
| 1802 | Partial undercut of the release layer |
| 1804 | Full undercut of the release layer |
| 1900 | RSOA or other device |
| 1902 | $1^{st}$ Etch stop |
| 1904 | Active (gain) region |

-continued

| List of features | |
|---|---|
| 1906 | Facet/ARC |
| 1908 | $2^{nd}$ Etch stop |
| 1910 | Tether layer |
| 1912 | Tethers |
| 1914 | Anchors |
| 1916 | Trenches |
| 1930 | Release layer |
| 1932 | Substrate |
| 1934 | $1^{st}$ intermediate semiconductor layer |
| 1936 | $2^{nd}$ intermediate semiconductor |
| 1938 | Upper semiconductor layer |
| 2000 | Hard mask |
| 2002 | Ridge |
| 2004 | Hard mask |
| 2006 | Via |
| 2008 | Hard mask |
| 2010 | Dielectric layer |
| 2012 | N-contact opening |
| 2014 | N-contact |
| 2016 | P-contact opening |
| 2018 | P-contact |
| 2020 | Routing metal |
| 2022 | Anti-reflective coating |
| 2024 | Hard mask coating |

The invention claimed is:

1. A device wafer, suitable for a micro-transfer printing process, the device wafer comprising:
   a multi-layered device coupon, comprising an optical component, a first semiconductor layer, a second semiconductor layer directly on the first semiconductor layer, and a third semiconductor layer directly on the second semiconductor layer;
   one or more support structures, connected to a device wafer substrate, each of the one or more support structures comprising a first support layer, corresponding to the first semiconductor layer, and a second support layer on the first support layer and corresponding to the second semiconductor layer; and
   one or more semiconductor tethers, which secure the device coupon to a respective support structure,
   wherein a first semiconductor tether of the one or more semiconductor tethers is part of the second semiconductor layer and extends from the device coupon to the respective support structure,
   wherein the first semiconductor tether has a break region located between the device coupon and the respective support structure, and the break region has a width which is narrower than adjacent regions of the first semiconductor tether,
   wherein a cavity is between a bottom of the multi-layered device coupon and an uppermost surface of the device wafer substrate, directly below the first semiconductor tether and between the first semiconductor layer and the first support layer, and directly above the first semiconductor tether and adjacent to the third semiconductor layer, and
   wherein a dielectric protection layer covers a side surface of each of the one or more support structures that face the cavity.

2. The device wafer of claim 1, wherein the break region is weaker than adjacent regions of the first semiconductor tether.

3. The device wafer of claim 1, wherein the break region is at least partially defined by two etched regions of the first semiconductor tether, said etched regions having a substantially triangular shape.

4. The device wafer of claim 3, wherein the two etched regions are offset from one another in a direction from the device coupon to the respective support structure.

5. The device wafer of claim 1, wherein each of the one or more support structures comprises a third support layer on the second support layer and corresponding to the third semiconductor layer, and
wherein the cavity is directly between the third semiconductor layer and the third support layer.

6. The device wafer of claim 1, wherein the second semiconductor layer, the first semiconductor tether, and the second support layer of the respective support structure form a single monolithic layer.

7. A method of preparing the device wafer of claim 1, the method comprising a process of preparing the device coupon from a multi-layered stack located on the device wafer substrate, the multi-layered stack comprising a plurality of semiconductor layers, the process comprising steps of:
(a) etching the multi-layered stack to form the multi-layered device coupon; and
(b) etching the second semiconductor layer of the multi-layered device coupon to form the one or more semiconductor tethers.

8. The method of claim 7, wherein the or each tether extends from the device coupon to a respective support structure, and wherein the or each tether has a break region located between the device coupon and respective support structure.

9. The method of claim 8, wherein the break region of the or each tether is weaker than adjacent regions of the or each tether.

10. The method of claim 8, wherein the break region of the or each tether has a width which is narrower than adjacent regions of the or each tether.

11. The method of claim 7, further including a step of performing a release etch, after step (b), in which a release layer between the device coupon and the device wafer substrate is etched away.

12. The method of claim 11, further including a step, after performing the release etch, of covering at least a part of the device coupon, a tether of the one or more tethers, and/or a support structure of the one or more support structures with a photoresist.

13. The method of claim 7, wherein the method includes a step of providing the dielectric protection layer around the or each support structure.

14. The method of claim 7, wherein the step of etching the second semiconductor layer of the multi-layered device coupon to form one or more tethers also includes forming the one or more support structures, the one or more support structures.

* * * * *